(12) United States Patent
Tomioka

(10) Patent No.: US 8,947,786 B2
(45) Date of Patent: Feb. 3, 2015

(54) VARIABLE MAGNIFICATION OPTICAL SYSTEM AND IMAGING APPARATUS

(71) Applicant: Fujifilm Corporation, Tokyo (JP)

(72) Inventor: Ukyo Tomioka, Saitama-ken (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 14/061,052

(22) Filed: Oct. 23, 2013

(65) Prior Publication Data

US 2014/0043691 A1 Feb. 13, 2014

Related U.S. Application Data

(63) Continuation of application No. PCT/JP2012/002983, filed on May 7, 2012.

(30) Foreign Application Priority Data

May 9, 2011 (JP) .................................. 2011-104128

(51) Int. Cl.
*G02B 15/14* (2006.01)
*G02B 13/04* (2006.01)
*G02B 13/14* (2006.01)
*G02B 13/18* (2006.01)
*G02B 15/177* (2006.01)
*H01L 27/146* (2006.01)

(52) U.S. Cl.
CPC ................ *G02B 13/04* (2013.01); *G02B 13/14* (2013.01); *G02B 13/18* (2013.01); *G02B 15/177* (2013.01); *H01L 27/14625* (2013.01)
USPC ............................. 359/691; 359/689; 359/682

(58) Field of Classification Search
CPC ..... G02B 15/16; G02B 15/163; G02B 15/177
USPC .................. 359/676, 680–682, 686, 689, 691
See application file for complete search history.

(56) References Cited

U.S. PATENT DOCUMENTS

| 6,888,682 | B2 | 5/2005 | Kawakami |
| 7,280,284 | B2 | 10/2007 | Ishii |
| 7,535,650 | B2 * | 5/2009 | Ohashi .......................... 359/676 |
| 7,589,910 | B2 * | 9/2009 | Ohashi .......................... 359/689 |

(Continued)

FOREIGN PATENT DOCUMENTS

| JP | 2004-271668 | 9/2004 |
| JP | 2009-230122 | 10/2009 |

OTHER PUBLICATIONS

International Search report, PCT/JP2012/002983, Jul. 17, 2012.

*Primary Examiner* — Darryl J Collins
(74) *Attorney, Agent, or Firm* — Young & Thompson

(57) ABSTRACT

A variable magnification optical system includes, in order from the object side, a negative first lens group and a positive second lens group, wherein the interval between these lens groups in the optical axis direction is changed during magnification change. The most image-side lens and the second most image-side lens of the first lens group are a negative single lens with a concave surface facing the object side and a positive single lens, respectively. The second lens group includes, in order from the object side, a positive lens disposed at the most object-side position with at least one surface thereof being an aspherical surface, a first cemented lens formed by a negative lens and a positive lens, and a second cemented lens formed by a negative lens and a positive lens.

17 Claims, 17 Drawing Sheets

EXAMPLE 1

(56) References Cited

U.S. PATENT DOCUMENTS

| | | |
|---|---|---|
| 7,907,351 B2 | 3/2011 | Tomioka |
| 8,477,427 B2 * | 7/2013 | Muratani et al. ............. 359/680 |
| 2004/0257670 A1 | 12/2004 | Kawakami |
| 2009/0219626 A1 | 9/2009 | Tomioka |
| 2012/0200746 A1 * | 8/2012 | Suzuki ...................... 348/240.3 |

* cited by examiner

FIG.4
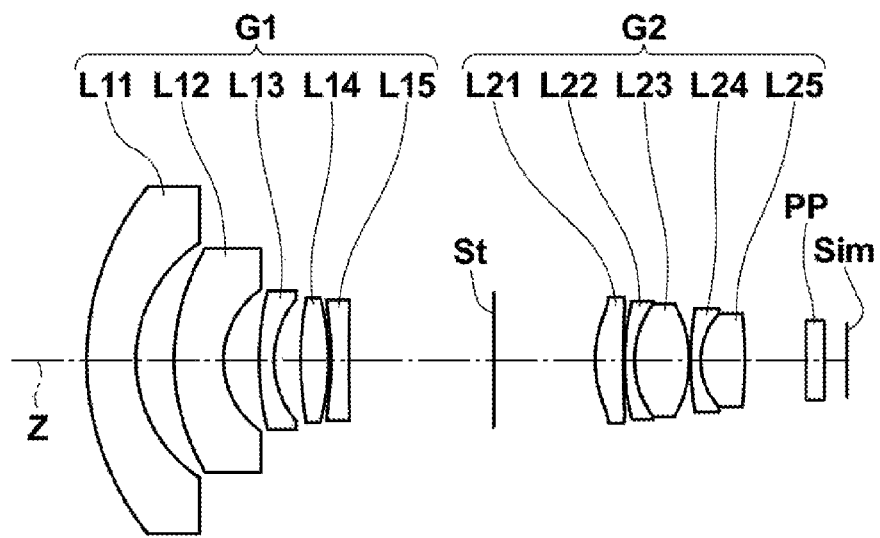
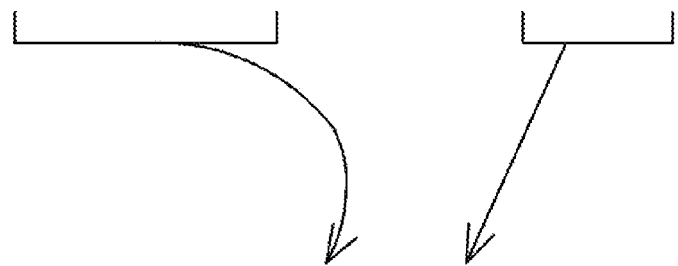

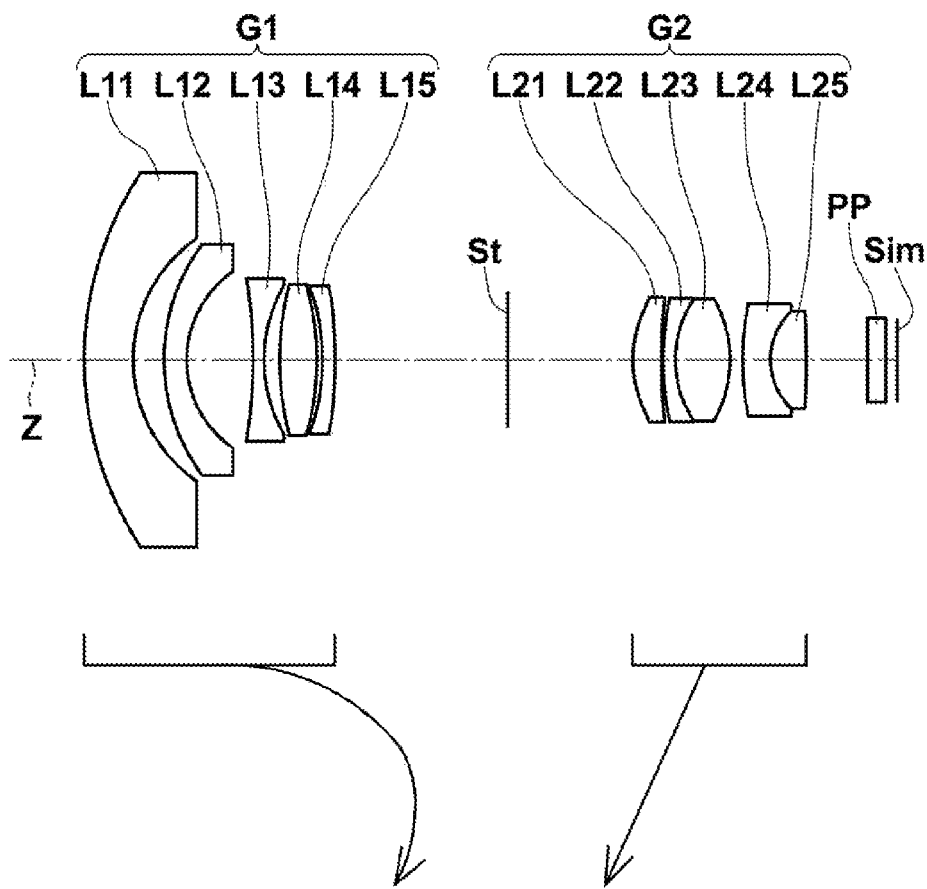

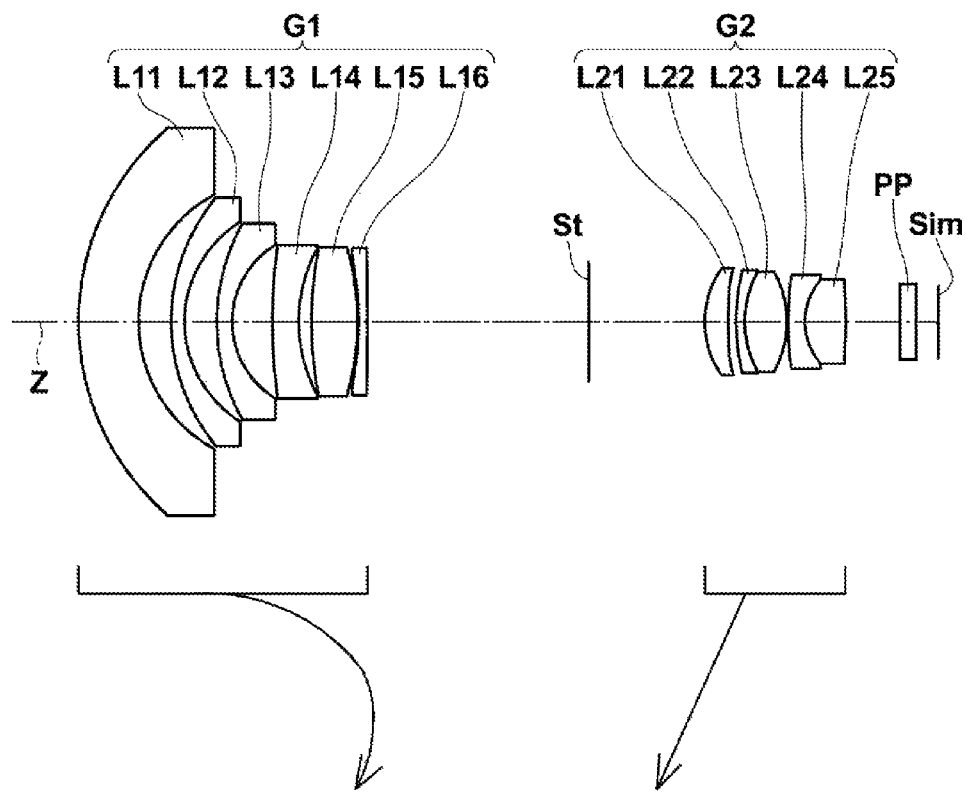

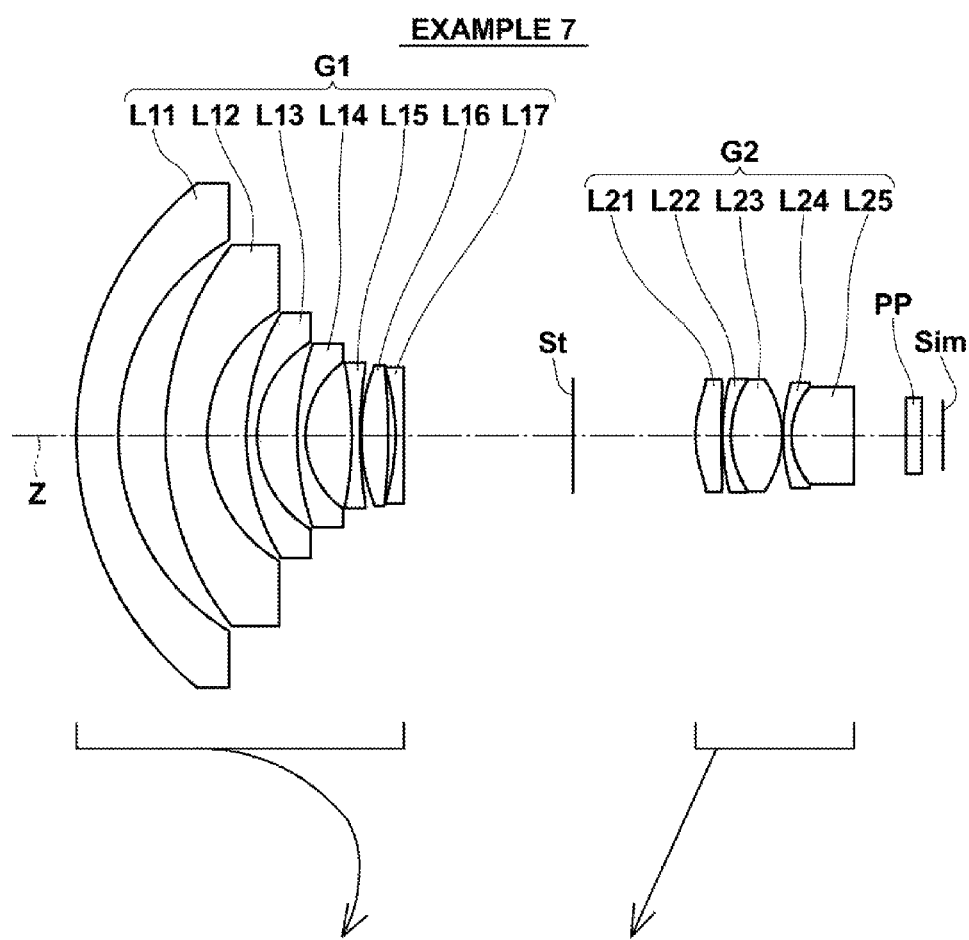

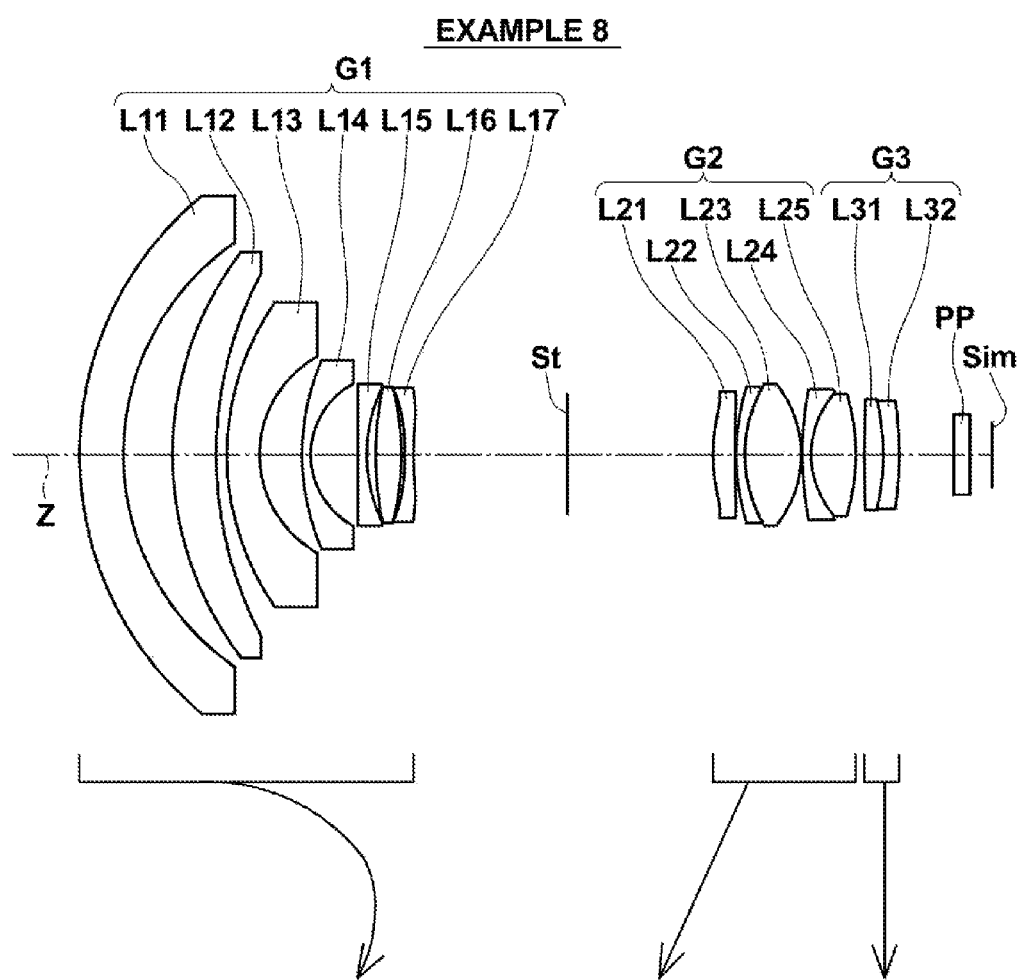

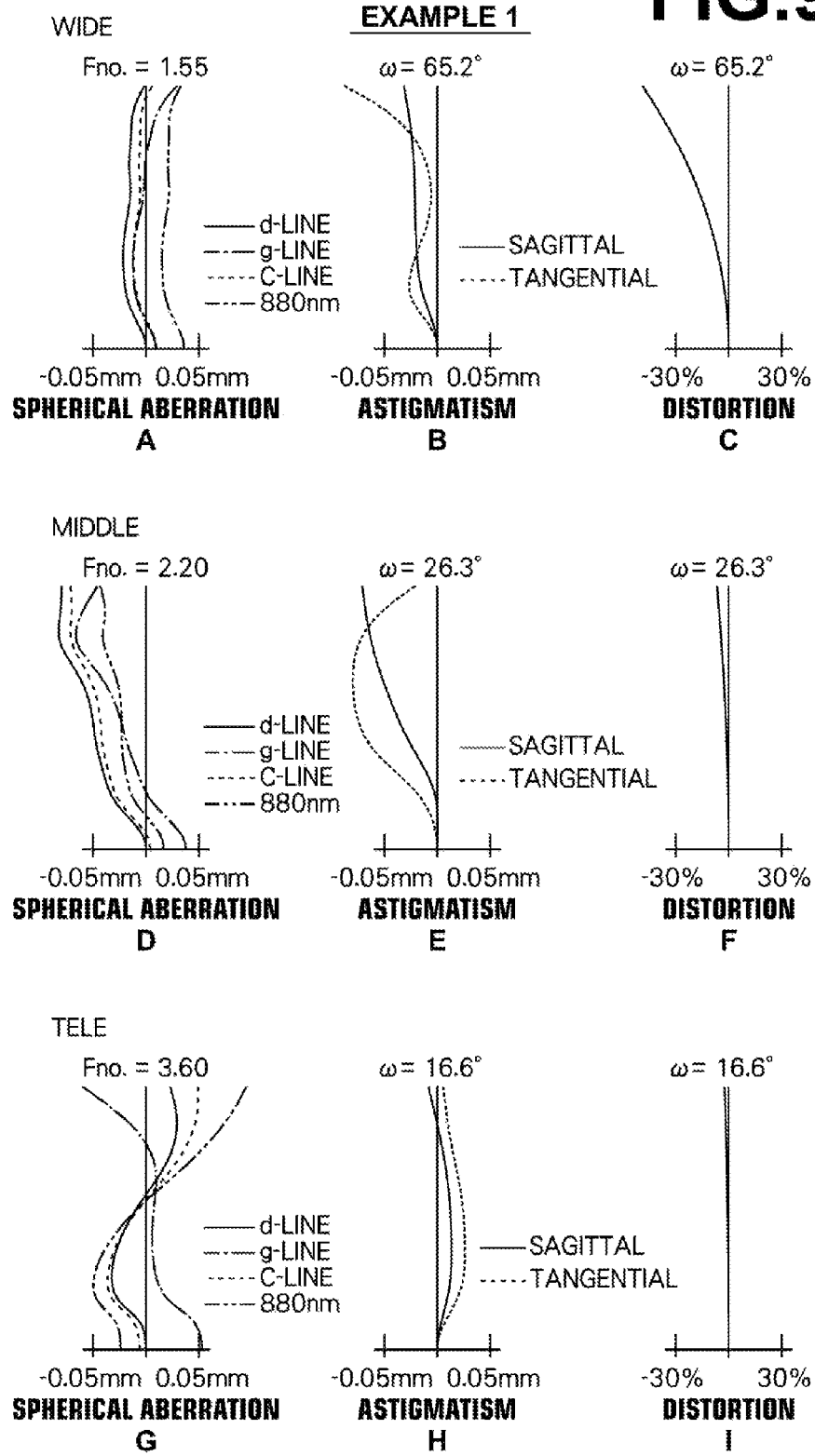

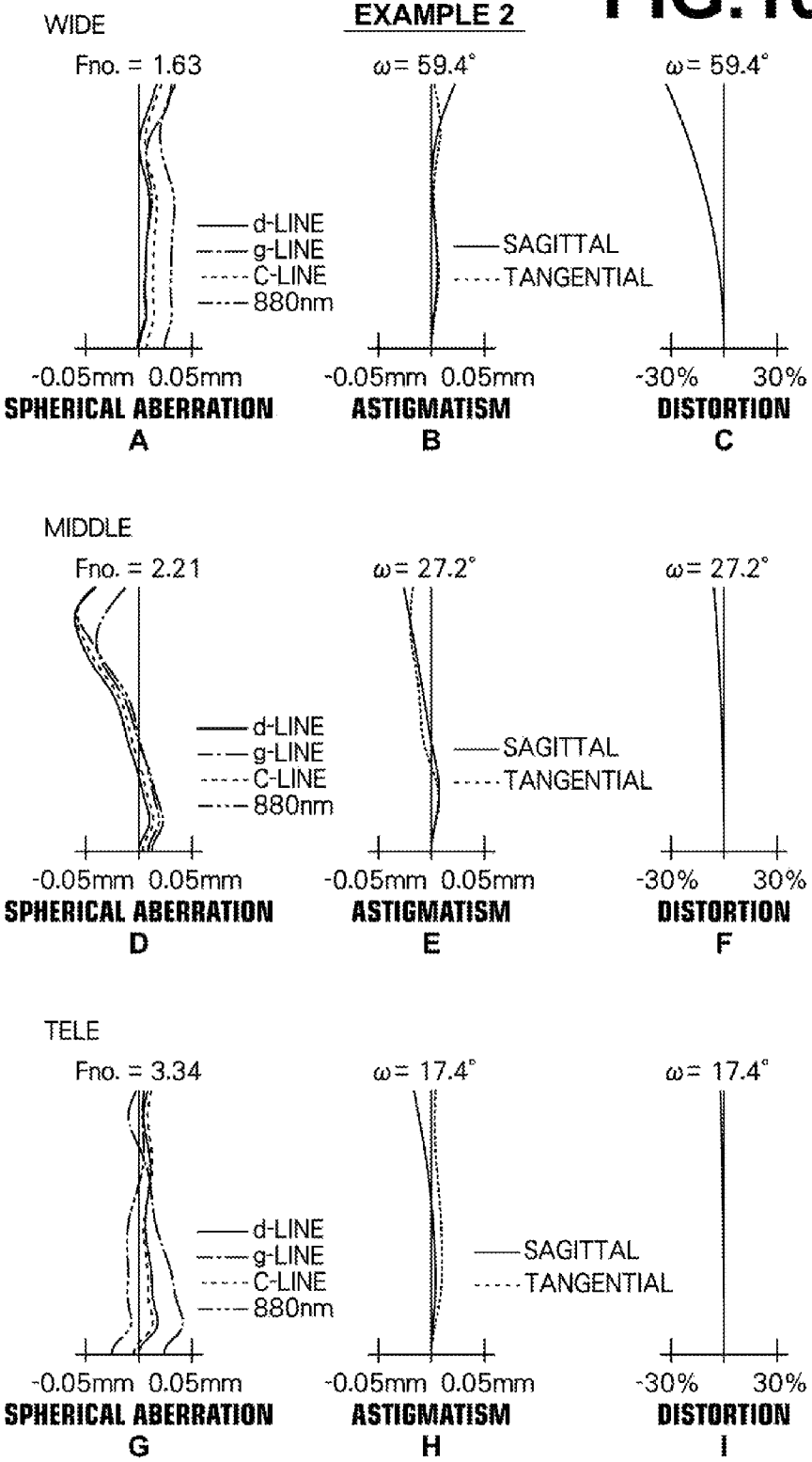

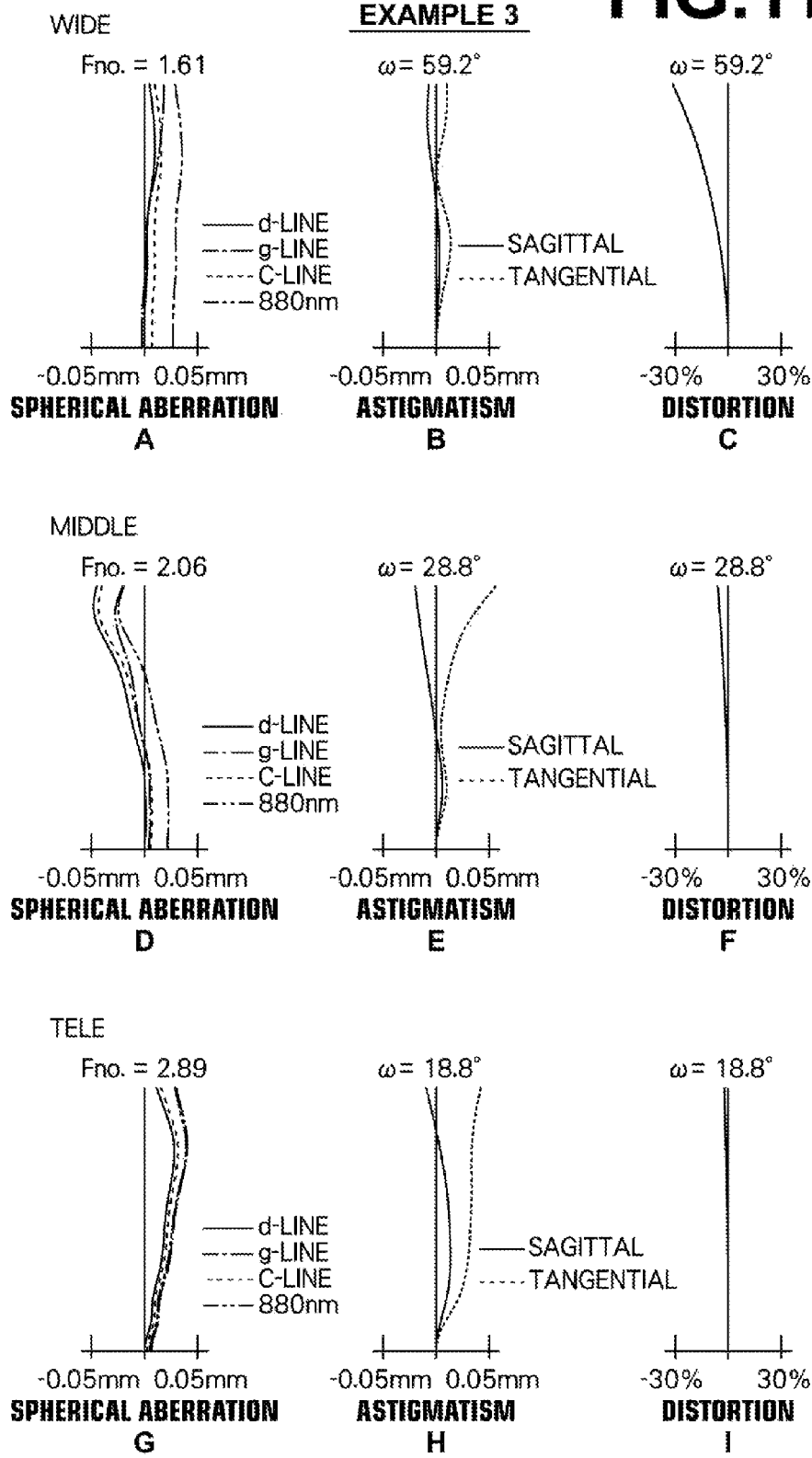

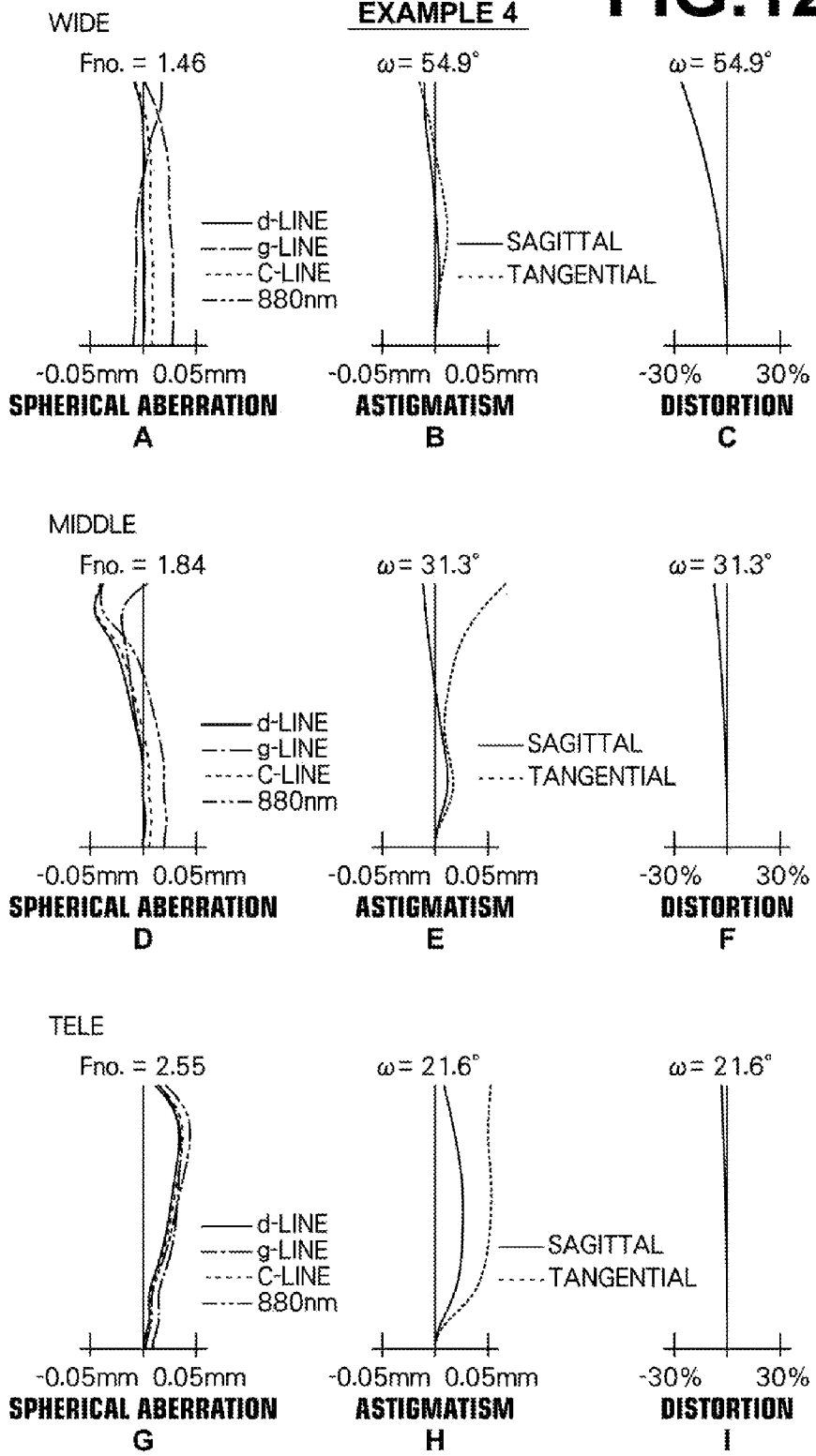

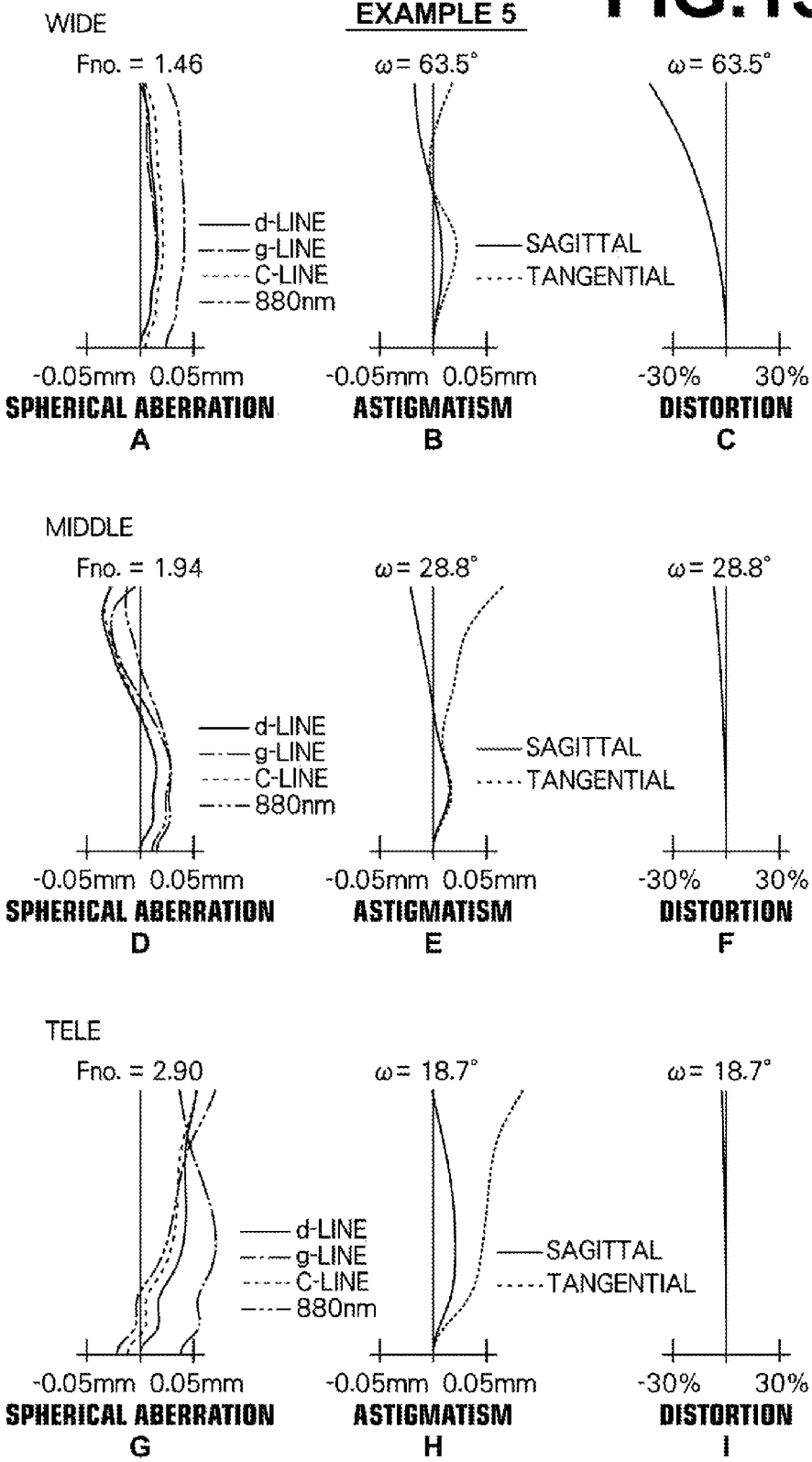

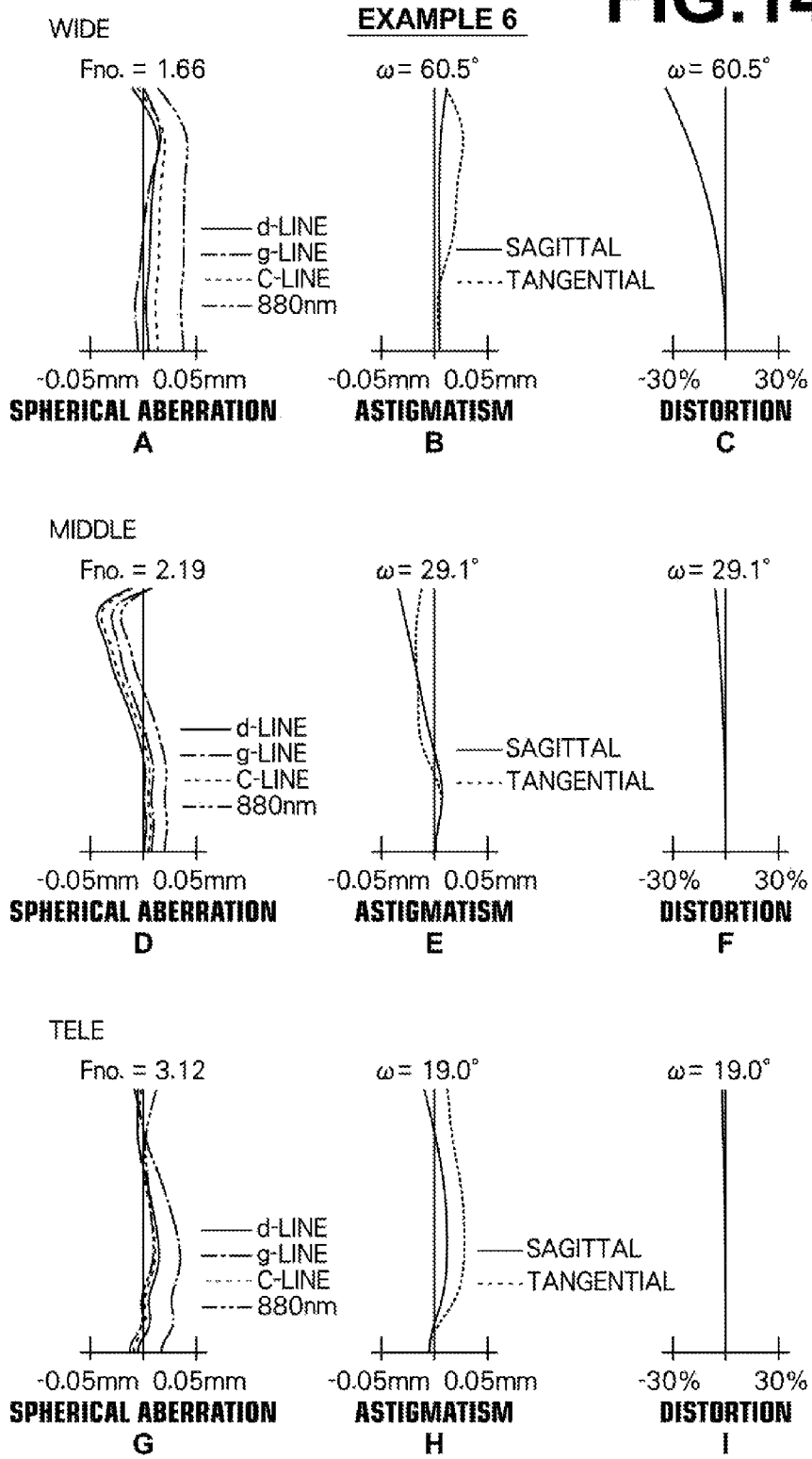

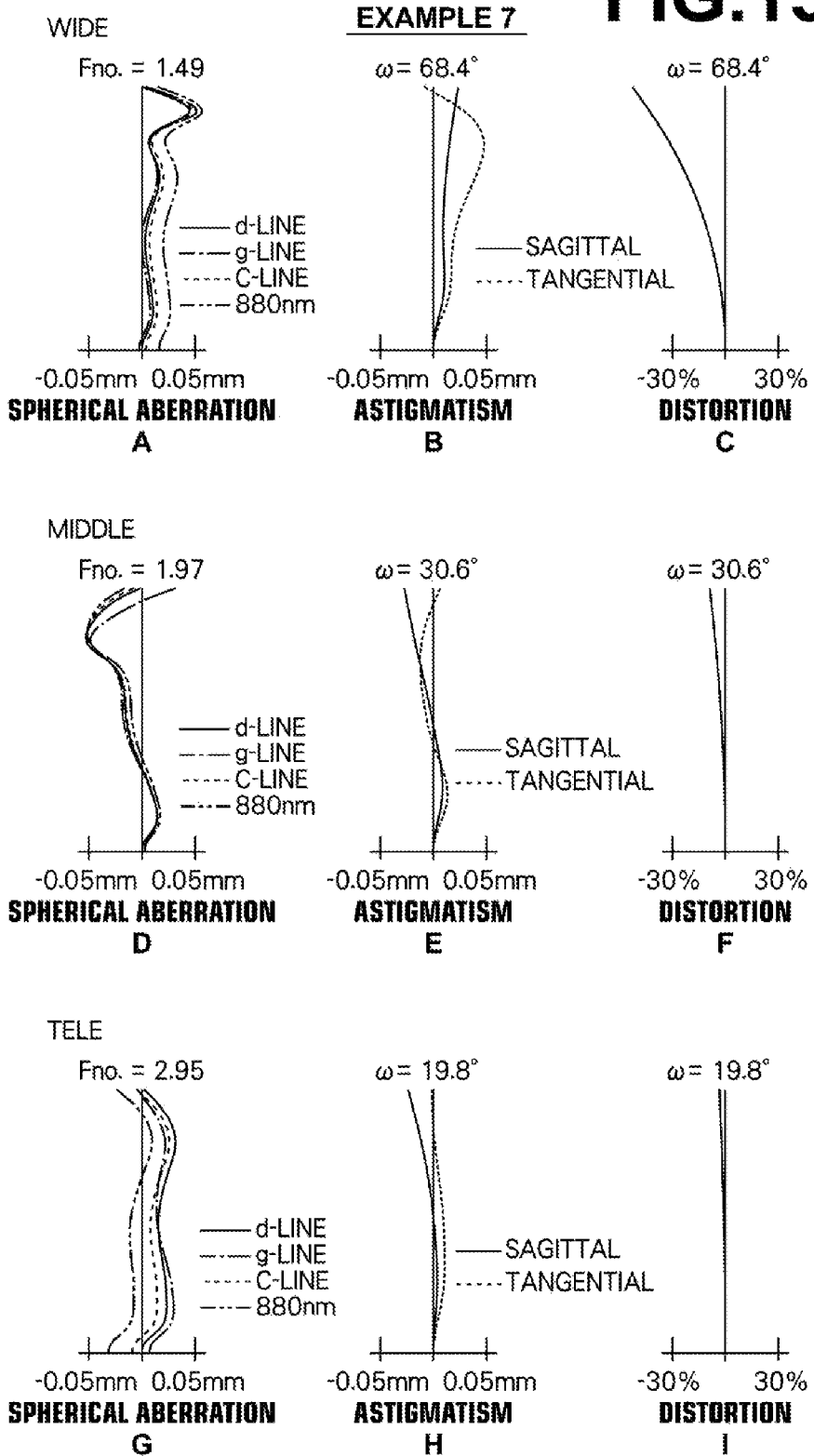

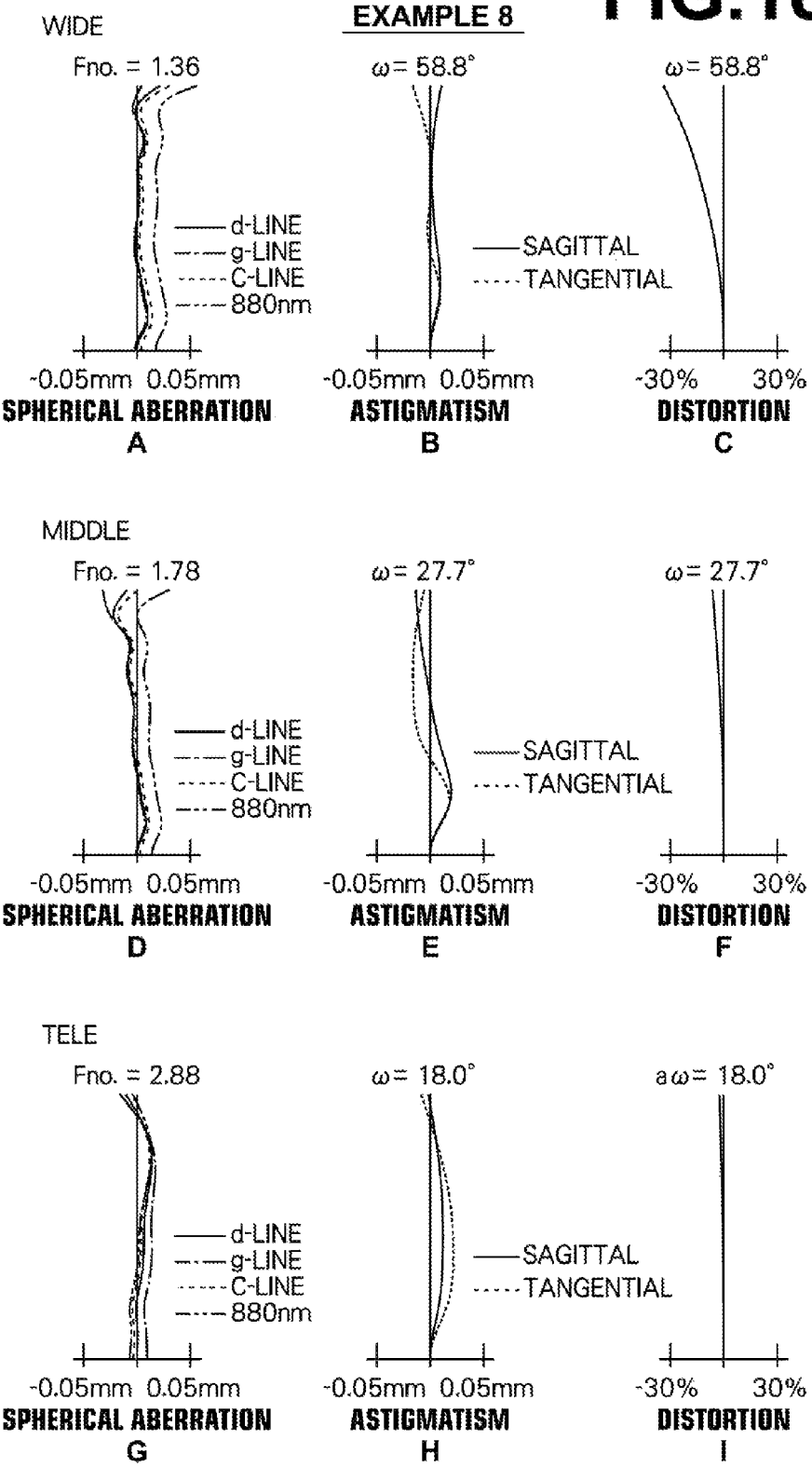

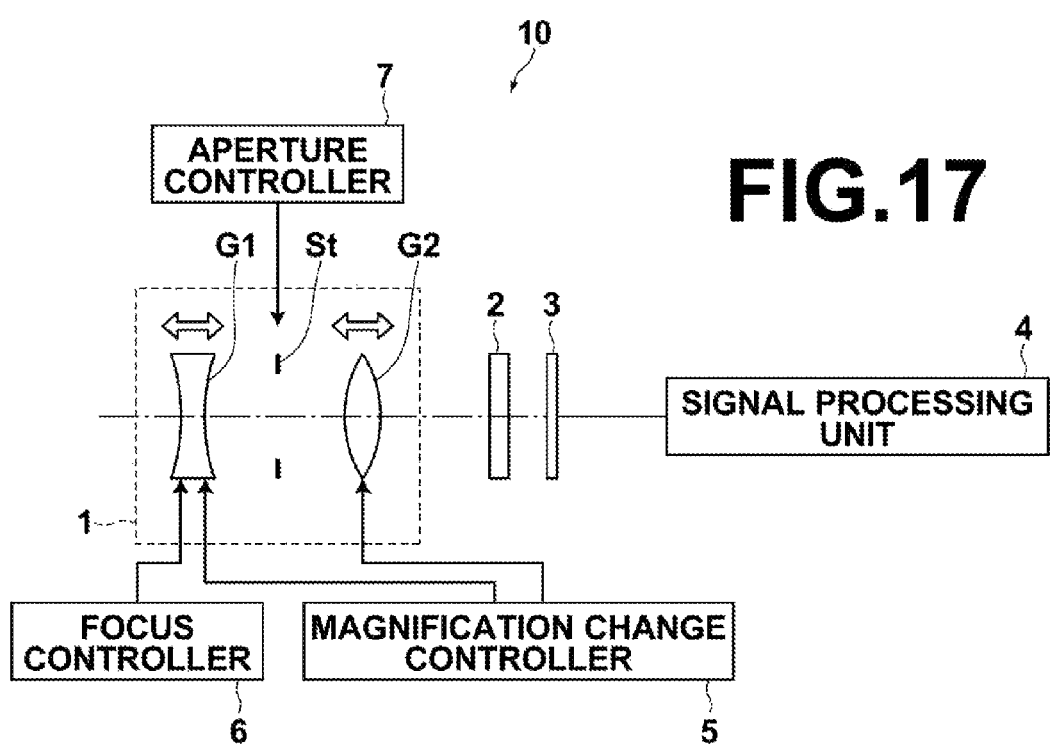

VARIABLE MAGNIFICATION OPTICAL SYSTEM AND IMAGING APPARATUS

CROSS REFERENCE TO RELATED APPLICATIONS

This application is a Bypass continuation of PCT/JP2012/002983 filed on May 7, 2012, which claims foreign priority to Japanese Application No. 2011-104128 filed on May 9, 2011. The entire contents of each of the above applications are hereby incorporated by reference.

TECHNICAL FIELD

The present invention relates to a variable magnification optical system for use with video cameras, electronic still cameras, etc., and to an imaging apparatus. More particularly, the present invention relates to a variable magnification optical system that is suitable for use with monitoring cameras and is usable in a wide wavelength range from the visible range to the near-infrared range, and to an imaging apparatus provided with the variable magnification optical system.

BACKGROUND ART

Conventionally, monitoring cameras are used for the purpose of security, recording, etc. It is required for an optical system for use with such a monitoring camera to be compact and able to be formed inexpensively, have high aperture ratio to allow identifying the subject even under a low illuminance imaging condition, have high zoom ratio to be able to accommodate from the wide-angle end, at which a wide-range image can be taken, to the telephoto end, at which a narrower range can be enlarged, and have high optical performance.

For an optical system for use with a day- and night-vision monitoring camera, which is often placed at an unmanned facility and performs visible light imaging during day and near-infrared light imaging during night, it is desired to maintain high optical performance with well corrected chromatic aberration over a wide wavelength range from the visible range to the near-infrared range.

As a variable magnification optical system with well corrected chromatic aberration from the visible range to the near-infrared range, one disclosed in U.S. Pat. No. 7,907,351 (hereinafter, Patent Document 1), for example, is known. The optical system disclosed in Patent Document 1 includes, in order from the object side, a negative first lens group and a positive second lens group, where magnification change is achieved by moving the second lens group along the optical axis, and correction of the image plane position along with the magnification change is achieved by moving the first lens group. Further, examples of a variable magnification optical system having a two-group configuration, where the magnification change is achieved by changing the interval between two lens groups, are disclosed, for example, in U.S. Pat. Nos. 7,280,284 and 6,888,682 (hereinafter, Patent Documents 2 and 3).

DISCLOSURE OF INVENTION

However, the optical system disclosed in Patent Document 2 is a zoom lens for use with single-lens reflex cameras, which has a f-number that is too large to be used with monitoring cameras and therefore is not deemed to have a high aperture ratio. The optical system disclosed in Patent Document 3 is a projection lens, which has a f-number that is too large to be used with monitoring cameras and has insufficient zoom ratio. Further, both the optical systems disclosed in Patent Documents 2 and 3 are not necessarily intended to be used to cover the wide wavelength range from the visible range to the near-infrared range. While the optical system disclosed in Patent Document 1 is suitable for use with monitoring cameras, monitoring cameras provided with an image sensor having 3,000,000 or more pixels are introduced in recent years, and there are increasing demands for high-quality images.

In view of the above-described circumstances, the present invention is directed to providing a variable magnification optical system that is compact, has high aperture ratio and high zoom ratio and keeps high optical performance that allows obtaining high-quality images over a wide wavelength band from the visible range to the near-infrared range, and an imaging apparatus provided with the variable magnification optical system.

A first aspect of the variable magnification optical system of the invention is a variable magnification optical system including, in order from an object side, a first lens group having a negative refractive power, a stop and a second lens group having a positive refractive power, the variable magnification optical system being configured such that magnification change is achieved by changing an interval between the first lens group and the second lens group in an optical axis direction, and correction of an image plane position along with the magnification change is achieved by moving the first lens group in the optical axis direction, wherein a most image-side lens in the first lens group is a single lens having a negative refractive power with a concave surface facing the object side and a second most image-side lens in the first lens group is a single lens having a positive refractive power, the second lens group includes, in order from the object side, a positive lens disposed at a most object-side position with at least one surface thereof being an aspherical surface, a first cemented lens formed by a negative lens and a positive lens that are cemented together in this order from the object side, and a second cemented lens formed by a negative lens and a positive lens that are cemented together in this order from the object side, an image-side surface of the negative lens forming the first cemented lens and an image-side surface of the negative lens forming the second cemented lens are concave surfaces, and conditional expression (1) below is satisfied:

$$-0.5 < (R23f + R23r)/(R23f - R23r) < 0.5 \qquad (1),$$

where R23f is a radius of curvature of an object-side surface of the positive lens forming the first cemented lens, and R23r is a radius of curvature of an image-side surface of the positive lens forming the first cemented lens.

A second aspect of the variable magnification optical system of the invention is a variable magnification optical system including, in order from an object side, a first lens group having a negative refractive power, a stop and a second lens group having a positive refractive power, the variable magnification optical system being configured such that magnification change is achieved by changing an interval between the first lens group and the second lens group in an optical axis direction, and correction of an image plane position along with the magnification change is achieved by moving the first lens group in the optical axis direction, wherein a most image-side lens in the first lens group is a single lens having a negative refractive power with a concave surface facing the object side and a second most image-side lens in the first lens group is a single lens having a positive refractive power, the second lens group includes, in order from the object side, a positive lens disposed at a most object-side position with at least one surface thereof being an aspherical surface, a first cemented lens formed by a negative lens and a positive lens that are cemented together in this order from the object side, and a second cemented lens formed by a negative lens and a positive lens that are cemented together in this order from the object side, the first cemented lens and the second cemented lens are disposed next to each other, and an image-side surface of the negative lens forming the first cemented lens and an image-side surface of the negative lens forming the second cemented lens are concave surfaces.

In the first and second aspects of the variable magnification optical system of the invention, it is preferable that conditional expressions (2) and (3) below are satisfied:

$$vd23>70.0 \quad (2) \text{ and}$$

$$vd25>70.0 \quad (3),$$

where vd23 is an Abbe number with respect to the d-line of the positive lens forming the first cemented lens, and vd25 is an Abbe number with respect to the d-line of the positive lens forming the second cemented lens.

In the first and second aspects of the variable magnification optical system of the invention, it is preferable that conditional expression (4) below is satisfied:

$$-1<R23r/R22f<0 \quad (4),$$

where R23r is a radius of curvature of an image-side surface of the positive lens forming the first cemented lens, and R22f is a radius of curvature of an object-side surface of the negative lens forming the first cemented lens.

In the first and second aspects of the variable magnification optical system of the invention, it is preferable that conditional expression (5) below is satisfied:

$$|R22r|-|R24r|>0 \quad (5),$$

where R22r is a radius of curvature of an image-side surface of the negative lens forming the first cemented lens, and R24r is a radius of curvature of an image-side surface of the negative lens forming the second cemented lens.

In the first and second aspects of the variable magnification optical system of the invention, it is preferable that the single lens having a positive refractive power disposed at the second most image-side position in the first lens group has a shape with a convex surface facing an image side.

In the first and second aspects of the variable magnification optical system of the invention, it is preferable that conditional expression (6) below is satisfied:

$$3.0<fG2/fw<5.0 \quad (6),$$

where fG2 is a focal length of the second lens group, and fw is a focal length of the entire system at a wide-angle end.

The first and second aspects of the variable magnification optical system of the invention may have a two-group configuration where lens groups thereof include only the first lens group and the second lens group.

Alternatively, the first and second aspects of the variable magnification optical system of the invention may further include a third lens group having a positive refractive power disposed on the image side of the second lens group, the third lens group being fixed during the magnification change. In this case, the first and second aspects of the variable magnification optical system of the invention may have a three-group configuration where lens groups thereof include only the first lens group, the second lens group and the third lens group.

In the first and second aspects of the variable magnification optical system of the invention, the first lens group may include at least one lens having a negative refractive power with at least one surface thereof being an aspherical surface.

It should be noted that the symbol (positive or negative) with respect to the surface shape and the refractive power of any lens including an aspherical surface of the above-described variable magnification optical system of the invention is that of the paraxial region.

It should be noted that the "lens group" herein may not necessarily include a plurality of lenses and there may be a lens group including only one lens.

It should be noted that the "single lens" herein refers to one lens that is not a cemented lens.

It should be noted that the symbol with respect to the radius of curvature herein means that a shape that is convex toward the object side is positive and a shape that is convex toward the image side is negative.

An imaging apparatus of the invention includes the variable magnification optical system of the first or second aspect of the invention.

In the first aspect of the variable magnification optical system of the invention, which includes, in order from the object side, a negative first lens group and a positive second lens group, wherein magnification change is achieved by changing the interval between the first lens group and the second lens group in the optical axis direction, and correction of the image plane position along with the magnification change is achieved by moving the first lens group in the optical axis direction, the configuration of the lenses disposed at the most image-side position and the second most image-side position of the first lens group is suitably set, and the lens configuration of the second lens group is suitably set in detail. More particularly, the second lens group includes an aspherical lens disposed at the most object side and two sets of cemented lenses, wherein the shape of the cemented surface of each of the two sets of cemented lenses is suitably set, and the shape of the positive lens forming the first cemented lens is set to satisfy the conditional expression (1). Therefore, according to the first aspect of the variable magnification optical system of the invention, a variable magnification optical system that is compact, has high aperture ratio and high zoom ratio, and has high optical performance that allows obtaining high-quality images over a wide wavelength band from the visible range to the near-infrared range can be accomplished.

In the second aspect of the variable magnification optical system of the invention, which includes, in order from the object side, a negative first lens group and a positive second lens group, wherein magnification change is achieved by changing the interval between the first lens group and the second lens group in the optical axis direction, and correction of the image plane position along with the magnification change is achieved by moving the first lens group in the optical axis direction, the configuration of the lenses disposed at the most image-side position and the second most image-side position of the first lens group is suitably set, and the lens configuration of the second lens group is suitably set in detail. More particularly, the second lens group includes an aspherical lens disposed at the most object side and two sets of cemented lenses, wherein the shape of the cemented surface of each of the two sets of cemented lenses is suitably set, and the positional relationship between the two sets of cemented lenses is set. Therefore, according to the second aspect of the variable magnification optical system of the invention, a variable magnification optical system that is compact, has high aperture ratio and high zoom ratio, and has high optical performance that allows obtaining high-quality images over a wide wavelength band from the visible range to the near-infrared range can be accomplished.

The imaging apparatus of the invention includes the variable magnification optical system of the first or second aspect of the invention, and therefore can be formed compact, can take images even under a low illumination condition, can have high magnifying power, and can obtain good images over a wide wavelength band from the visible range to the near-infrared range.

BRIEF DESCRIPTION OF THE DRAWINGS

FIG. 4 is a sectional view illustrating the lens configuration of a variable magnification optical system of Example 4 of the invention, FIG. 5 is a sectional view illustrating the lens configuration of a variable magnification optical system of Example 5 of the invention, FIG. 6 is a sectional view illustrating the lens configuration of a variable magnification optical system of Example 6 of the invention, FIG. 7 is a sectional view illustrating the lens configuration of a variable magnification optical system of Example 7 of the invention, FIG. 8 is a sectional view illustrating the lens configuration of a variable magnification optical system of Example 8 of the invention, FIG. 9 shows, at A to I, aberration diagrams of the variable magnification optical system of Example 1 of the invention, FIG. 10 shows, at A to I, aberration diagrams of the variable magnification optical system of Example 2 of the invention, FIG. 11 shows, at A to I, aberration diagrams of the variable magnification optical system of Example 3 of the invention, FIG. 12 shows, at A to I, aberration diagrams of the variable magnification optical system of Example 4 of the invention, FIG. 13 shows, at A to I, aberration diagrams of the variable magnification optical system of Example 5 of the invention, FIG. 14 shows, at A to I, aberration diagrams of the variable magnification optical system of Example 6 of the invention, FIG. 15 shows, at A to I, aberration diagrams of the variable magnification optical system of Example 7 of the invention, FIG. 16 shows, at A to I, aberration diagrams of the variable magnification optical system of Example 8 of the invention, and FIG. 17 is a schematic configuration diagram of an imaging apparatus according to an embodiment of the invention.

DESCRIPTION OF PREFERRED EMBODIMENTS

Figure 1:
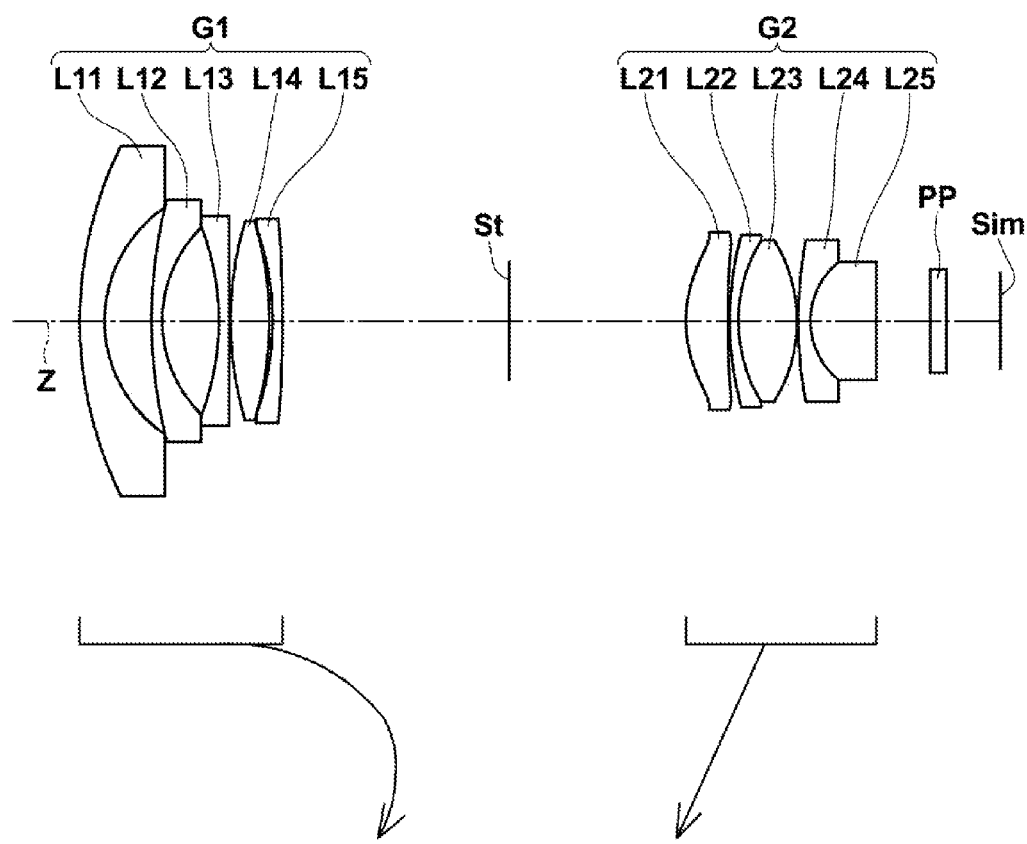
FIG. 1 is a sectional view illustrating the lens configuration of a variable magnification optical system of Example 1 of the present invention.
Figure 2:
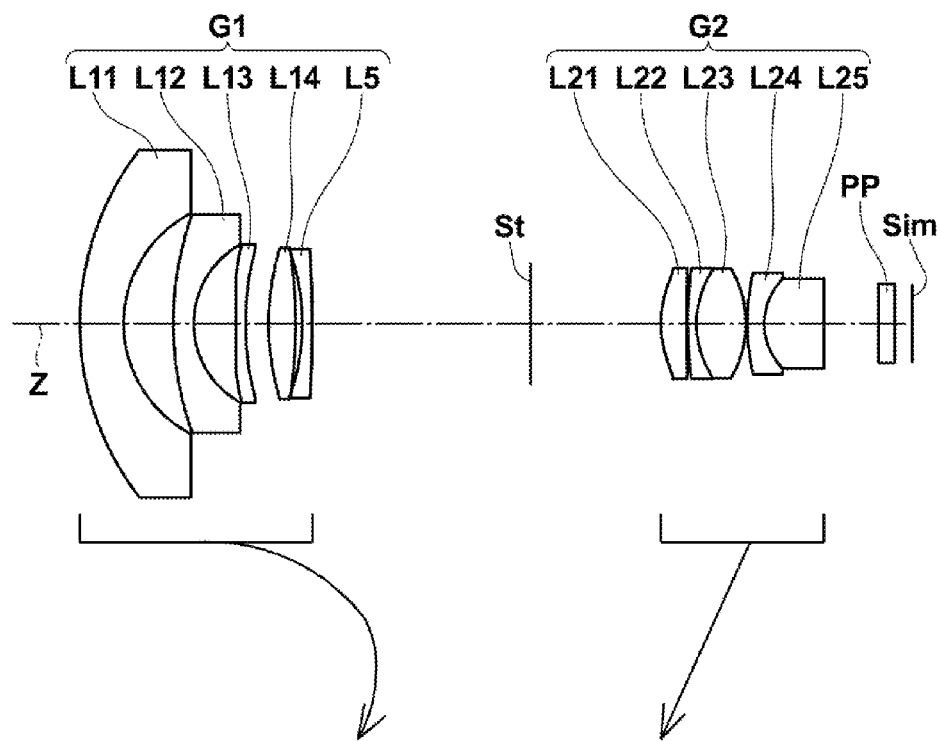
FIG. 2 is a sectional view illustrating the lens configuration of a variable magnification optical system of Example 2 of the invention.
Figure 3:
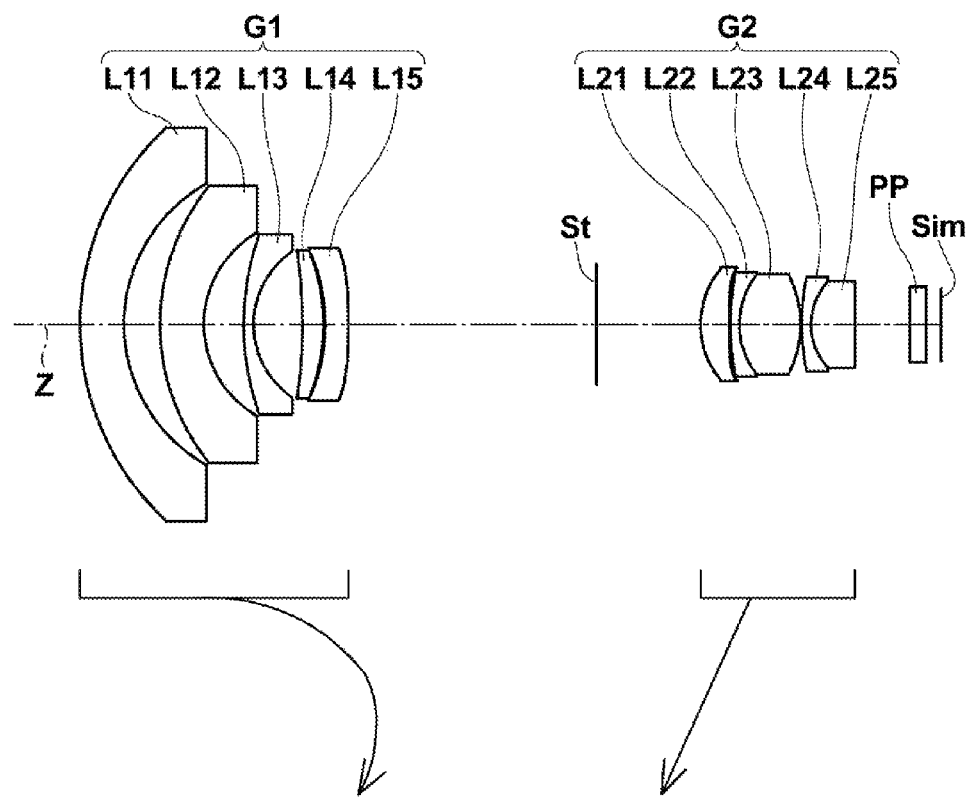
FIG. 3 is a sectional view illustrating the lens configuration of a variable magnification optical system of Example 3 of the invention.

Hereinafter, embodiments of the present invention will be described in detail with reference to the drawings. FIG. 1 is a sectional view illustrating a configuration example of a variable magnification optical system according to an embodiment of the invention and corresponds to a variable magnification optical system of Example 1, which will be described later. FIGS. 2 to 8 are sectional views illustrating other configuration examples according to the embodiment of the invention and correspond to variable magnification optical systems of Examples 2 to 8, respectively, which will be described later. The examples shown in FIGS. 1 to 8 has the same basic configuration and are shown in the same manner in the drawings. Therefore, the variable magnification optical system according to the embodiment of the invention is described mainly with reference to FIG. 1.

This variable magnification optical system includes, in order from the object side, a first lens group G1 having a negative refractive power, an aperture stop St, and a second lens group G2 having a positive refractive power, wherein magnification change is achieved by changing the interval between the first lens group G1 and the second lens group G2 in the optical axis direction, and correction of the image plane position along with the magnification change is achieved by moving the first lens group G1 in the optical axis direction.

The variable magnification optical system of the invention may be a varifocal lens that achieves the magnification change by moving the second lens group G2 in the optical axis direction and achieves correction of the image plane position along with the magnification change by moving the first lens group G1 in the optical axis direction. Alternatively, the variable magnification optical system of the invention may be a zoom lens. For example, the example shown in FIG. 1 is an example of a varifocal lens, where the magnification change from the wide-angle end to the telephoto end is achieved by moving the second lens group G2 along the optical axis toward the object side.

In the example shown in FIG. 1, the aperture stop St is fixed relative to an image plane Sim during the magnification change. It should be noted that the aperture stop St shown in FIG. 1 does not necessarily represents the size and the shape thereof but represents the position thereof along the optical axis Z. In FIG. 1, the left side corresponds to the object side and the right side corresponds to the image side. The lens configuration shown in FIG. 1 shows a lens position when an object at infinite distance is focused at the wide-angle end, and the locus of movement of each lens group during the magnification change from the wide-angle end to the telephoto end is schematically shown by an arrow below the lens group.

In a case where the variable magnification optical system is mounted on an imaging apparatus, it is preferable to provide the imaging apparatus with a cover glass to protect the imaging surface of the image sensor, a prism, such as a color separation prism, according to specifications of the imaging apparatus, and various filters, such as a low-pass filter, an infrared cutoff filter, etc. Under this assumption, in the example shown in FIG. 1, a parallel plate-like optical member PP is disposed between the most image-side lens group and the image plane Sim.

As shown in FIG. 1, for example, the first lens group G1 may have a five-lens configuration including, in order from the object side, a lens L11 that is a negative meniscus lens having a convex surface facing the object side, a lens L12 that is a negative meniscus lens having a convex surface facing the object side, a lens L13 that is a negative lens, a lens L14 that is a positive lens and a lens L15 that is a negative lens.

The first lens group G1 is configured such that a negative single lens (the lens L15 in the example shown in FIG. 1) having a concave surface facing the object side is disposed at the most image-side position, and a positive single lens (the lens L14 in the example shown in FIG. 1) is disposed at the second most image-side position. Disposing such lenses at the most image-side position and the second most image-side position of the first lens group G1 allows successful correction of spherical aberration and longitudinal chromatic aberration at the telephoto end, thereby ensuring good optical performance from the visible range to the near-infrared range.

It is preferable that the positive single lens that is the second most image-side lens in the first lens group G1 has a shape with a convex surface facing the image side. This configuration allows successful correction of longitudinal chromatic aberration mainly at the telephoto end using the combination of the negative single lens and the positive single lens disposed at the most image-side position and the second most image-side position, respectively, of the first lens group G1.

Further, it is preferable that the first lens group G1 includes at least one lens having a negative refractive power with at least one surface thereof being an aspherical surface. This configuration allows successful control of astigmatism at the wide-angle end and also allows successful correction of spherical aberration at the telephoto end.

In a case where importance is placed on size reduction and cost reduction, it is preferable that the first lens group G1 has a five-lens configuration, as in the examples shown in FIGS. 1 to 5. On the other hand, in a case where importance is placed on higher optical performance and higher specifications, the first lens group G1 may have a six-lens configuration or a seven-lens configuration, as in the examples shown in FIGS. 6 to 8.

As shown in FIG. 1, the second lens group G2 is configured to include, in order from the object side, a lens L21 that is a positive lens disposed at the most object-side position with at least one surface thereof being an aspherical surface, a first cemented lens formed by a lens L22 that is a negative lens and a lens L23 that is a positive lens cemented together in this order from the object side, and a second cemented lens formed by a lens L24 that is a negative lens and a lens L25 that is a positive lens cemented together in this order from the object side.

Disposing the positive lens L21 with at least one surface thereof being an aspherical surface at the most object-side position of the second lens group G2 allows obtaining high optical performance with achieving high aperture ratio and high zoom ratio. At the same time, disposing the two cemented lenses, i.e., the first and second cemented lenses having the above-described configuration on the image side of the lens L21 allows achieving high optical performance from the visible range to the near-infrared range.

If the order of the positive and negative lenses forming each of the first and the second cemented lenses is different from that in the above-described configuration, it is difficult to achieve successful correction of chromatic spherical aberration. As described above, it is desired that an optical system for use with a monitoring camera has a high aperture ratio, and therefore the correction of spherical aberration is more difficult than that of an optical system having a large f-number. Since the variable magnification optical system of the invention is further directed to obtaining good optical performance from the visible range to the near-infrared range, the configuration of the cemented lenses included in the second lens group G2 is important.

In the case where importance is placed on size reduction and cost reduction, it is preferable that the second lens group G2 has the above-described five-lens configuration including the lenses L21 to L25.

Both the image-side surface of the negative lens L22 of the first cemented lens and the image-side surface of the negative lens L24 of the second cemented lens of the second lens group G2 have a concave surface shape. Each of these two surfaces is a cemented surface between the negative lens and the positive lens, and this shape allows successful correction of chromatic aberration from the visible range to the near-infrared range.

It is preferable that the first cemented lens and the second cemented lens of the second lens group G2 are disposed next to each other with no lens member disposed therebetween. This arrangement is advantageous in achieving size reduction while achieving successful correction of chromatic aberration from the visible range to the near-infrared range.

It is preferable that the variable magnification optical system of the invention satisfy conditional expression (1) below:

$$-0.5<(R23f+R23r)/(R23f-R23r)<0.5 \quad (1),$$

where R23f is a radius of curvature of the object-side surface of the positive lens L23 forming the first cemented lens, and R23r is a radius of curvature of the image-side surface of the positive lens L23 forming the first cemented lens.

The conditional expression (1) relates to the shape of the positive lens L23 forming the first cemented lens. If the upper limit of the conditional expression (1) is exceeded, the chromatic aberration correction effect of the first cemented lens decreases and it is difficult to achieve high optical performance from the visible range to the near-infrared range. If the lower limit of the conditional expression (1) is not reached, it is difficult to achieve successful correction of spherical aberration, in particular, at the wide-angle end.

In view of the above-described circumstances, it is more preferable that conditional expression (1-1) below is satisfied in place of the conditional expression (1):

$$-0.25<(R23f+R23r)/(R23f-R23r)<0.25 \quad (1-1).$$

Further, it is preferable that the variable magnification optical system of the invention satisfies conditional expressions (2) and (3) below:

$$vd23>70.0 \quad (2) \text{ and}$$

$$vd25>70.0 \quad (3),$$

where vd23 is an Abbe number with respect to the d-line of the positive lens L23 forming the first cemented lens, and vd25 is an Abbe number with respect to the d-line of the positive lens L25 forming the second cemented lens.

The conditional expressions (2) and (3) relate to the materials of the positive lens L23 forming the first cemented lens and the positive lens L25 forming the second cemented lens. If lower limits of the conditional expressions (2) and (3) are not reached, longitudinal chromatic aberration increases over the entire range from the wide-angle end to the telephoto end and it is difficult to ensure good optical performance from the visible range to the near-infrared range.

In view of the above-described circumstances, it is more preferable that conditional expression (2-1) below is satisfied in place of the conditional expression (2) and conditional expression (3-1) below is satisfied in place of the conditional expression (3):

$$vd23>80.0 \quad (2-1) \text{ and}$$

$$vd25>80.0 \quad (3-1).$$

Further, it is preferable that the variable magnification optical system of the invention satisfies conditional expression (4) below:

$$-1<R23r/R22f<0 \quad (4),$$

where R23r is a radius of curvature of the image-side surface of the positive lens L23 forming the first cemented lens, and R22f is a radius of curvature of the object-side surface of the negative lens L22 forming the first cemented lens.

The conditional expression (4) relates to the ratio of the radius of curvature of the image-side surface to the radius of curvature of the object-side surface of the first cemented lens when the first cemented lens is regarded as one lens. Since the variable magnification optical system of the invention includes, in order from the object side, the first lens group G1 having a negative refractive power and the second lens group G2 having a positive refractive power, the first cemented lens included in the second lens group G2 usually has a positive refractive power as a whole. If the upper limit of the conditional expression (4) is exceeded, the first cemented lens has a meniscus shape and the positive refractive power of the second lens group G2 decreases, and it is difficult to achieve size reduction and to provide high magnifying power.

In the case where the first cemented lens has a positive refractive power as a whole, the first cemented lens has a biconvex shape in the range where the upper limit of the conditional expression (4) is met. Therefore, the object-side surface of the lens L22 is a convex surface. As described above, the image-side surface of the lens L22 is a concave surface. Therefore, in the range where the upper limit of the conditional expression (4) is met, the lens L22 is a meniscus lens having the concave surface facing the image side. If the lower limit of the conditional expression (4) is not reached, R22f becomes small and approaches the radius of curvature of the image-side surface of the lens L22, resulting in weak negative refractive power of the lens L22. This decreases the chromatic aberration correction effect of the first cemented lens and it is difficult to achieve high optical performance from the visible range to the near-infrared range.

In view of the above-described circumstances, it is more preferable that conditional expression (4-1) below is satisfied in place of the conditional expression (4):

$$-0.7 < R23r/R22f < 0 \tag{4-1}$$

Further, it is preferable that the variable magnification optical system of the invention satisfies conditional expression (5) below:

$$|R22r| - |R24r| > 0 \tag{5}$$

where R22r is a radius of curvature of the image-side surface of the negative lens L22 forming the first cemented lens, and R24r is a radius of curvature of the image-side surface of the negative lens L24 forming the second cemented lens.

The conditional expression (5) relates to the radius of curvatures of the cemented surfaces of the two cemented lenses included in the second lens group G2. If the lower limit of the conditional expression (5) is not reached, the chromatic aberration correction effect of the cemented surfaces of the lens L22 and the lens L24, which otherwise have high longitudinal chromatic aberration correction effect, decreases, and it is difficult to achieve high optical performance from the visible range to the near-infrared range.

Further, it is preferable that the variable magnification optical system of the invention satisfy conditional expression (6) below:

$$3.0 < fG2/fw < 5.0 \tag{6}$$

where fG2 is a focal length of the second lens group G2, and fw is a focal length of the entire system at the wide-angle end.

The conditional expression (6) relates to the ratio of the refractive power of the second lens group G2 to that of the entire system. If the upper limit of the conditional expression (6) is exceeded, the amount of movement of the second lens group G2 along with the magnification change increases and this inhibits the size reduction of the optical system. If the lower limit of the conditional expression (6) is not reached, the refractive power of the second lens group G2 becomes strong, resulting in excessive correction of spherical aberration and therefore degradation of performance.

It should be noted that, as in the example shown in FIG. 8, for example, the variable magnification optical system of the invention may further include a third lens group having a positive refractive power disposed on the image side of the second lens group G2. The third lens group is fixed during the magnification change. This configuration allows improving tendency of excessive correction of spherical aberration at the intermediate position in the zoom range, thereby maintaining good optical performance not only at the wide-angle end and the telephoto end but also at the intermediate area.

According to the variable magnification optical system of the above-described embodiment of the invention, a lens system that has a compact configuration including at least two lens groups and around ten lenses, and has a high zoom ratio of about 2.6× to 4×, a high aperture ratio with an f-number at the wide-angle end of about 1.3 to 1.6, and a wide angle with a total angle of view at the wide-angle end of about 110 to 140 degrees at the same time can easily be achieved.

It should be noted that, in a case where the variable magnification optical system of the invention is used in a severe environment, such as an outdoor environment, it is preferable that a lens disposed at the most object-side position is formed using a material that is resistant to surface deterioration due to weather, resistant to temperature change due to exposure to direct sunlight, and resistant to chemicals, such as oils, detergents, etc., i.e., a material having high water resistance, high weather resistance, high acid resistance, high chemical resistance, etc., and being hard and shatter proof. In a case where importance is placed on satisfying these demands, a preferred material forming the most object-side lens is glass, or a transparent ceramic may be used.

Further, in the case where the variable magnification optical system of the invention is used in a severe environment, it is preferable that a protective multi-layer coating is applied. Besides the protective coating, an antireflection coating film may be applied to reduce ghost light, etc., during use.

It should be noted that, while the optical member PP is disposed on the image side of the most image-side lens in the example shown in FIG. 1, any of various filters may be disposed between the lenses, or a coating having the same effect as any of various filters may be applied to a lens surface of any of the lenses.

Next, numerical examples of the variable magnification optical system of the invention are described. FIGS. 1 to 8 show lens sectional views of variable magnification optical systems of Examples 1 to 8, respectively. Each of the variable magnification optical systems of Examples 1 to 8 is configured such that magnification change from the wide-angle end to the telephoto end is achieved by moving the second lens group G2 toward the object side along the optical axis, and correction of the image plane position along with the magnification change is achieved by moving the first lens group G1 in the optical axis direction.

Examples 1 to 5 are two-group configurations including, in order from the object side, the first lens group G1 having a five-lens configuration including lenses L11 to L15 and the second lens group having a five-lens configuration including lenses L21 to L25. Example 6 is a two-group configuration including, in order from the object side, the first lens group G1 having a six-lens configuration including lenses L11 to L16 and the second lens group G2 having a five-lens configuration including lenses L21 to L25. Example 7 is a two-group configuration including, in order from the object side, the first lens group G1 having a seven-lens configuration including lenses L11 to L17 and the second lens group G2 having a five-lens configuration including lenses L21 to L25. Example 8 is a three-group configuration including, in order from the object side, the first lens group G1 having a seven-lens configuration including lenses L11 to L17, the second lens group G2 having a five-lens configuration including lenses L21 to L25 and the third lens group G3 having a two-lens configuration including lenses L31 to L32. The third lens group G3 of Example 8 has a positive refractive power and is fixed during the magnification change. All the Examples 1 to 8 include an aperture stop St that is disposed between the first lens group G1 and the second lens group G2 and is fixed during the magnification change.

Basic lens data, aspherical coefficients, and magnification change-related data of the variable magnification optical system of Example 1 are shown in Table 1, Table 2 and Table 3, respectively. Similarly, basic lens data and aspherical coefficients of variable magnification optical systems of Examples 2 to 8 are shown in Tables 3 to 24, respectively. The meanings of the symbols used in the tables are described below using the tables with respect to Example 1 as an example. Basically the same symbols are used in the tables with respect to Examples 2 to 8, and the same explanation is not repeated for the tables with respect to Examples 2 to 8.

In Table 1 showing the basic lens data, each value in the column of "Si" represents the surface number of the i-th (i=1, 2, 3, . . . ) surface, where the object-side surface of the most object-side element is the 1st surface and the number is sequentially increased toward the image side; each value in the column of "Ri" represents the radius of curvature of the i-th surface; each value in the column of "Di" represents the surface interval between the i-th surface and the i+1-th surface along the optical axis Z, where the lowermost numerical value in the column of "Di" represents the surface interval between the last surface shown in the table and the image plane Sim; each value in the column of "Ndj" represents the refractive index with respect to the d-line (wavelength of 587.6 nm) of the j-th (j=1, 2, 3, . . . ) optical element, where the most object-side optical element is the 1st optical element and the number is sequentially increased toward the image side; and each value in the column of "vdj" represents the Abbe number with respect to the d-line of the j-th optical element.

It should be noted that the symbol with respect to the radius of curvature means that a surface shape that is convex toward the object side is positive and a surface shape that is convex toward the image side is negative. The table of the basic lens data also includes data of the aperture stop St and the optical member PP. At the position of the surface number corresponding to the aperture stop St in the column of surface number, the text "(aperture stop)" is also shown.

In the table of the basic lens data, the texts "variable 1", "variable 2" and "variable 3" shown in the column of surface interval indicate surface intervals that are changed during the magnification change. The variable 1 is the interval between the first lens group G1 and the aperture stop St, and the variable 2 is the interval between the aperture stop St and the second lens group G2. The variable 3 in Examples 1 to 7 is the interval between the second lens group G2 and the optical member PP, and the variable 3 in Example 8 is the interval between the second lens group G2 and the third lens group G3.

In the table of the basic lens data, aspherical surfaces are indicated by the symbol "*" added to the surface number thereof, and a numerical value of a paraxial radius of curvature is shown as the radius of curvature of each aspherical surface. Table 2 shows aspherical coefficients of each aspherical surface, where "E-n" (where n is an integer) following each numerical value of the aspherical coefficient shown in Table 2 means "×10$^{-n}$", and "E+n" means "×10$^{n}$". The aspherical coefficients are values of coefficients K and Am (where m=3, 4, 5, . . . , 20) in the aspherical surface equation below:

$$Zd = \frac{C \times Y^2}{1 + \sqrt{1 - K \times C^2 \times Y^2}} + \sum_{m} A_m Y^m,$$

where Zd is a depth of aspherical surface (a length of a perpendicular line from a point with a height Y on the aspherical surface to a plane tangent to the apex of the aspherical surface and perpendicular to the optical axis), Y is the height (a distance from the optical axis to the lens surface), C is a paraxial curvature, and K and Am are aspherical coefficients (where m=3, 4, 5, . . . , 20).

In Table 3 showing the magnification change-related data, values of the focal length of the entire system, the Fno. (f-number), the total angle of view, the variable 1, the variable 2 and the variable 3 at the wide-angle end, at an intermediate focal position and at the telephoto end are shown. In the tables shown below, the unit of the angle is degrees and the unit of the length is millimeter; however, since optical systems can be used with being proportionally enlarged or reduced, any other suitable units may be used. The numerical values shown in the tables herein are rounded at predetermined decimal places.

TABLE 1

Example 1

| Si | Ri | Di | Ndj | vdj |
|---|---|---|---|---|
| 1 | 36.3719 | 2.31 | 1.78590 | 44.2 |
| 2 | 12.7413 | 4.36 | | |
| 3 | 46.1746 | 0.99 | 1.90366 | 31.3 |
| 4 | 12.2077 | 5.26 | | |
| 5 | −24.5543 | 0.96 | 1.60300 | 65.4 |
| 6 | ∞ | 0.10 | | |
| 7 | 32.0979 | 3.60 | 1.84666 | 23.8 |
| 8 | −32.0979 | 0.33 | | |
| 9 | −25.5735 | 0.90 | 1.71700 | 47.9 |
| 10 | −122.1715 | variable 1 | | |
| 11 (aperture stop) | ∞ | variable 2 | | |
| 12* | 12.3113 | 3.90 | 1.56865 | 58.3 |
| 13* | 540.2259 | 0.15 | | |
| 14 | 30.5183 | 0.80 | 1.72916 | 54.7 |
| 15 | 14.3520 | 5.44 | 1.49700 | 81.5 |
| 16 | −14.3520 | 0.10 | | |
| 17 | 41.1003 | 1.14 | 1.80100 | 35.0 |
| 18 | 7.0900 | 6.10 | 1.49700 | 81.5 |
| 19 | ∞ | variable 3 | | |
| 20 | ∞ | 1.50 | 1.51633 | 64.1 |
| 21 | ∞ | 5.03 | | |

TABLE 2

Example 1

Aspherical coefficients of 12th surface

| K | A3 | A4 | A5 | A6 |
|---|---|---|---|---|
| 2.42133E+00 | 7.71911E−05 | −1.79255E−04 | 1.15076E−05 | −1.56358E−06 |
| A7 | A8 | A9 | A10 | A11 |
| −6.04602E−07 | 2.42180E−08 | 2.77702E−08 | −4.09355E−09 | −3.59925E−10 |
| A12 | A13 | A14 | A15 | A16 |
| −1.87049E−11 | 1.99772E−11 | 6.51423E−13 | −1.61898E−13 | −4.39565E−14 |
| A17 | A18 | A19 | A20 | |
| −2.61944E−15 | 4.02202E−16 | 2.08253E−16 | −2.00705E−17 | |

Aspherical coefficients of 13th surface

| K | A3 | A4 | A5 | A6 |
|---|---|---|---|---|
| −2.71619E+05 | 9.53577E−05 | 3.25170E−04 | −1.01143E−04 | 2.36074E−05 |
| A7 | A8 | A9 | A10 | A11 |
| −1.55662E−06 | −2.02458E−07 | −5.52251E−09 | 5.68892E−09 | 5.71788E−10 |
| A12 | A13 | A14 | A15 | A16 |
| −1.23435E−10 | 4.09587E−12 | −2.64642E−12 | 1.00535E−13 | 3.79871E−14 |
| A17 | A18 | A19 | A20 | |
| 2.42922E−15 | −2.06388E−16 | −1.01262E−16 | 7.63321E−18 | |

TABLE 3

Example 1

| Position | Focal length | Fno. | Total angle of view | Variable 1 | Variable 2 | Variable 3 |
|---|---|---|---|---|---|---|
| Wide-angle end | 4.01 | 1.55 | 130.41 | 21.04 | 16.36 | 5.00 |
| Intermediate | 9.64 | 2.20 | 52.61 | 2.17 | 8.53 | 12.83 |
| Telephoto end | 15.26 | 3.60 | 33.25 | 2.97 | 0.69 | 20.67 |

TABLE 4

Example 2

| Si | Ri | Di | Ndj | vdj |
|---|---|---|---|---|
| 1 | 25.9363 | 4.00 | 1.77250 | 49.6 |
| 2 | 11.4087 | 4.53 | | |
| 3 | 29.9543 | 1.85 | 1.77250 | 49.6 |
| 4 | 8.2740 | 3.89 | | |
| 5* | −94.2373 | 0.90 | 1.74843 | 34.2 |
| 6* | 42.4247 | 2.08 | | |
| 7 | 23.5190 | 2.48 | 1.84666 | 23.8 |
| 8 | −46.5830 | 0.62 | | |
| 9 | −19.6304 | 0.90 | 1.80001 | 48.0 |
| 10 | −104.7345 | variable 1 | | |
| 11 (aperture stop) | ∞ | variable 2 | | |
| 12* | 9.6937 | 2.35 | 1.56865 | 58.3 |
| 13* | 456.3352 | 0.10 | | |
| 14 | 37.6866 | 0.80 | 1.69680 | 55.5 |
| 15 | 9.0993 | 4.50 | 1.49700 | 81.5 |
| 16 | −10.0063 | 0.12 | | |
| 17 | 20.9455 | 1.55 | 1.80100 | 35.0 |
| 18 | 5.8869 | 5.44 | 1.43875 | 94.9 |
| 19 | 5799.7144 | variable 3 | | |
| 20 | ∞ | 1.50 | 1.51633 | 64.1 |
| 21 | ∞ | 1.58 | | |

TABLE 5

Example 2

Aspherical coefficients of 5th surface

| K | A3 | A4 | A5 | A6 |
|---|---|---|---|---|
| −2.93015E+01 | 2.53136E−04 | 2.53036E−04 | 1.54188E−05 | −1.55172E−06 |
| A7 | A8 | A9 | A10 | A11 |
| 1.36190E−07 | −2.51699E−08 | −5.09011E−09 | 2.39894E−10 | 5.63651E−11 |
| A12 | A13 | A14 | A15 | A16 |
| −5.13874E−12 | 2.55817E−12 | −6.17723E−14 | 8.79880E−15 | −3.31683E−15 |
| A17 | A18 | A19 | A20 | |
| −4.68260E−16 | −1.49706E−18 | −1.04854E−18 | 5.72808E−19 | |

Aspherical coefficients of 6th surface

| K | A3 | A4 | A5 | A6 |
|---|---|---|---|---|
| 1.88863E+01 | 2.26813E−04 | 1.53190E−04 | 1.47182E−05 | −1.57119E−06 |
| A7 | A8 | A9 | A10 | A11 |
| −2.85384E−07 | −1.36374E−08 | −2.53150E−10 | 2.77680E−10 | 2.59962E−11 |
| A12 | A13 | A14 | A15 | A16 |
| 3.25125E−12 | −1.24892E−13 | −6.82456E−14 | −2.64004E−14 | −1.20409E−15 |
| A17 | A18 | A19 | A20 | |
| −2.04720E−17 | 6.71278E−19 | 2.97838E−19 | 5.05288E−19 | |

TABLE 5-continued

Example 2

Aspherical coefficients of 12th surface

| K | A3 | A4 | A5 | A6 |
|---|---|---|---|---|
| 2.80393E+00 | −3.44518E−05 | 4.51163E−04 | 3.17387E−05 | −1.06760E−05 |
| A7 | A8 | A9 | A10 | A11 |
| −3.73766E−06 | 3.00633E−07 | 3.00142E−07 | −6.05957E−08 | −7.49127E−09 |
| A12 | A13 | A14 | A15 | A16 |
| −7.48064E−10 | 7.14988E−10 | 3.12911E−11 | −9.68435E−12 | −3.94314E−12 |
| A17 | A18 | A19 | A20 | |
| −2.89649E−13 | 6.18404E−14 | 4.54451E−14 | −6.00115E−15 | |

Aspherical coefficients of 13th surface

| K | A3 | A4 | A5 | A6 |
|---|---|---|---|---|
| −3.70675E+05 | 51.1391814E−004 | 7.13006E−04 | −3.47148E−04 | 1.08231E−04 |
| A7 | A8 | A9 | A10 | A11 |
| −1.10549E−05 | −1.41667E−06 | −6.57400E−08 | 8.05448E−08 | 1.08283E−08 |
| A12 | A13 | A14 | A15 | A16 |
| −3.31286E−09 | 1.68922E−10 | −1.35405E−10 | 6.65398E−12 | 3.45419E−12 |
| A17 | A18 | A19 | A20 | |
| 2.95543E−13 | −3.74222E−14 | −2.08329E−14 | 2.15451E−15 | |

TABLE 6

Example 2

| Position | Focal length | Fno. | Total angle of view | Variable 1 | Variable 2 | Variable 3 |
|---|---|---|---|---|---|---|
| Wide-angle end | 2.90 | 1.63 | 118.74 | 19.95 | 11.91 | 5.00 |
| Intermediate | 6.81 | 2.21 | 54.36 | 2.67 | 6.57 | 10.33 |
| Telephoto end | 10.72 | 3.34 | 34.88 | 1.89 | 1.24 | 15.67 |

TABLE 7

Example 3

| Si | Ri | Di | Ndj | vdj |
|---|---|---|---|---|
| 1 | 24.5100 | 4.00 | 1.77250 | 49.6 |
| 2 | 14.8024 | 3.31 | | |
| 3 | 20.2555 | 4.00 | 1.72916 | 54.7 |
| 4 | 9.7018 | 3.63 | | |
| 5 | 24.7134 | 0.90 | 1.72916 | 54.7 |
| 6 | 8.1004 | 4.47 | | |
| 7 | −45.6852 | 1.92 | 2.03796 | 24.2 |
| 8 | −17.9971 | 0.14 | | |
| 9* | −17.7204 | 2.13 | 1.66134 | 58.4 |
| 10* | −58.9721 | variable 1 | | |
| 11 (aperture stop) | ∞ | variable 2 | | |
| 12* | 8.3708 | 2.61 | 1.56865 | 58.3 |
| 13* | 464.6324 | 0.10 | | |
| 14 | 26.9440 | 0.80 | 1.76615 | 45.5 |
| 15 | 7.4144 | 5.59 | 1.49700 | 81.5 |
| 16 | −10.2177 | 0.10 | | |
| 17 | 21.0849 | 0.87 | 1.84483 | 39.2 |
| 18 | 5.8857 | 4.00 | 1.49700 | 81.5 |
| 19 | −558.9056 | variable 3 | | |
| 20 | ∞ | 1.50 | 1.51633 | 64.1 |
| 21 | ∞ | 1.37 | | |

TABLE 8

Example 3

Aspherical coefficients of 9th surface

| K | A3 | A4 | A5 | A6 |
|---|---|---|---|---|
| 7.04511E−01 | −1.25490E−04 | −1.36713E−04 | 5.64304E−07 | 8.00999E−06 |
| A7 | A8 | A9 | A10 | A11 |
| −1.07116E−06 | 1.41212E−09 | −1.72646E−09 | 4.21284E−10 | 1.95283E−10 |
| A12 | A13 | A14 | A15 | A16 |
| −1.34378E−12 | −4.24662E−13 | −2.04555E−13 | −1.38344E−13 | −8.10365E−15 |
| A17 | A18 | A19 | A20 | |
| 3.38197E−15 | 2.13816E−16 | 1.85399E−17 | −6.99641E−18 | |

Aspherical coefficients of 10th surface

| K | A3 | A4 | A5 | A6 |
|---|---|---|---|---|
| 5.30756E+01 | −9.22650E−05 | −1.79172E−04 | 1.24964E−05 | 7.16013E−07 |
| A7 | A8 | A9 | A10 | A11 |
| −4.50657E−08 | −8.31480E−09 | −3.55383E−09 | −2.31130E−10 | 2.12494E−11 |
| A12 | A13 | A14 | A15 | A16 |
| 6.59120E−12 | −1.04168E−12 | 2.37935E−13 | 1.26580E−14 | −7.66392E−15 |
| A17 | A18 | A19 | A20 | |
| 7.48268E−16 | −5.48901E−17 | −5.41483E−18 | 9.33221E−19 | |

TABLE 8-continued

Example 3

Aspherical coefficients of 12th surface

| K | A3 | A4 | A5 | A6 |
|---|---|---|---|---|
| 2.13233E+00 | 1.85136E−04 | −3.71180E−04 | 5.91714E−05 | −5.71101E−06 |
| A7 | A8 | A9 | A10 | A11 |
| −3.23915E−06 | 1.92987E−07 | 3.19566E−07 | −5.83721E−08 | −6.92501E−09 |
| A12 | A13 | A14 | A15 | A16 |
| −5.29505E−10 | 7.12424E−10 | 3.16203E−11 | −1.02825E−11 | −3.83181E−12 |
| A17 | A18 | A19 | A20 | |
| −2.98609E−13 | 6.62196E−14 | 4.59294E−14 | −6.17031E−15 | |

Aspherical coefficients of 13th surface

| K | A3 | A4 | A5 | A6 |
|---|---|---|---|---|
| −3.78514E+05 | 2.29414E−04 | 9.15071E−04 | −3.30492E−04 | 1.13061E−04 |
| A7 | A8 | A9 | A10 | A11 |
| −8.92090E−06 | −1.57598E−06 | −7.63497E−08 | 8.53844E−08 | 1.19681E−08 |
| A12 | A13 | A14 | A15 | A16 |
| −3.20927E−09 | 1.71345E−10 | −1.26270E−10 | 6.72053E−12 | 3.52704E−12 |
| A17 | A18 | A19 | A20 | |
| 2.53314E−13 | −3.94164E−14 | −2.26230E−14 | 2.55900E−15 | |

TABLE 9

Example 3

| Position | Focal length | Fno. | Total angle of view | Variable 1 | Variable 2 | Variable 3 |
|---|---|---|---|---|---|---|
| Wide-angle end | 2.87 | 1.61 | 118.45 | 22.68 | 9.52 | 5.00 |
| Intermediate | 6.37 | 2.06 | 57.59 | 3.92 | 5.28 | 9.24 |
| Telephoto end | 9.88 | 2.89 | 37.67 | 1.49 | 1.04 | 13.48 |

TABLE 10

Example 4

| Si | Ri | Di | Ndj | vdj |
|---|---|---|---|---|
| 1 | 22.7189 | 4.00 | 1.77250 | 49.6 |
| 2 | 11.4766 | 3.15 | | |
| 3 | 17.9410 | 4.00 | 1.83481 | 42.7 |
| 4 | 7.0699 | 2.91 | | |
| 5 | 23.5228 | 1.22 | 1.83481 | 42.7 |
| 6 | 7.8760 | 2.18 | | |
| 7 | 27.8831 | 2.28 | 1.84666 | 23.8 |
| 8 | −19.4582 | 0.24 | | |
| 9* | −22.9241 | 1.43 | 1.80001 | 42.6 |
| 10* | 108.7352 | variable 1 | | |
| 11 (aperture stop) | ∞ | variable 2 | | |
| 12* | 9.4956 | 2.30 | 1.56865 | 58.3 |
| 13* | 433.3120 | 0.10 | | |
| 14 | 19.2161 | 0.80 | 1.72916 | 54.7 |
| 15 | 7.7958 | 4.50 | 1.49700 | 81.5 |
| 16 | −9.2217 | 0.10 | | |
| 17 | 25.4943 | 0.80 | 1.80100 | 35.0 |
| 18 | 5.5810 | 3.61 | 1.49700 | 81.5 |
| 19 | −32.3197 | variable 3 | | |
| 20 | ∞ | 1.50 | 1.51633 | 64.1 |
| 21 | ∞ | 1.85 | | |

TABLE 11

Example 4

Aspherical coefficients of 9th surface

| K | A3 | A4 | A5 | A6 |
|---|---|---|---|---|
| −3.87656E+00 | −8.03212E−04 | 1.49916E−04 | 2.60125E−05 | 2.92345E−06 |
| A7 | A8 | A9 | A10 | A11 |
| −1.18684E−06 | 5.99945E−08 | 2.21698E−08 | −1.29634E−09 | 1.16419E−09 |
| A12 | A13 | A14 | A15 | A16 |
| 6.91799E−12 | −2.67109E−11 | −4.48570E−12 | −5.62750E−13 | 3.31303E−14 |
| A17 | A18 | A19 | A20 | |
| 3.46940E−14 | 6.38557E−15 | 2.67850E−16 | −2.35870E−16 | |

Aspherical coefficients of 10th surface

| K | A3 | A4 | A5 | A6 |
|---|---|---|---|---|
| −6.68381E+01 | −7.17520E−04 | 2.47294E−05 | 9.61191E−06 | −3.82686E−07 |
| A7 | A8 | A9 | A10 | A11 |
| −8.13841E−09 | −1.30558E−10 | 5.21048E−12 | 1.16805E−14 | 1.50561E−15 |
| A12 | A13 | A14 | A15 | A16 |
| 9.84807E−17 | 4.21223E−18 | 1.29363E−19 | 4.46466E−21 | 1.88547E−22 |
| A17 | A18 | A19 | A20 | |
| 8.57691E−25 | 3.45069E−25 | 1.86092E−26 | 6.63338E−28 | |

TABLE 11-continued

Example 4

Aspherical coefficients of 12th surface

| K | A3 | A4 | A5 | A6 |
|---|---|---|---|---|
| 2.09986E+00 | 1.84801E−04 | −4.56479E−04 | 5.86107E−05 | −3.83720E−06 |
| A7 | A8 | A9 | A10 | A11 |
| −3.26237E−06 | −1.02756E−06 | 5.12768E−07 | −5.81940E−08 | −8.66467E−09 |
| A12 | A13 | A14 | A15 | A16 |
| −7.26616E−10 | 6.94879E−10 | 2.63256E−11 | −1.02624E−11 | −3.74689E−12 |
| A17 | A18 | A19 | A20 | |
| −3.15781E−13 | 6.99035E−14 | 4.58480E−14 | −6.05001E−15 | |

Aspherical coefficients of 13th surface

| K | A3 | A4 | A5 | A6 |
|---|---|---|---|---|
| −3.59482E+05 | 2.72193E−04 | 7.70700E−04 | −3.16217E−04 | 1.08414E−04 |
| A7 | A8 | A9 | A10 | A11 |
| −1.05165E−05 | −2.30534E−06 | 7.23979E−08 | 8.12579E−08 | 9.32165E−09 |
| A12 | A13 | A14 | A15 | A16 |
| −3.59107E−09 | 1.36437E−10 | −1.27259E−10 | 7.96313E−12 | 3.47970E−12 |
| A17 | A18 | A19 | A20 | |
| 3.26319E−13 | −3.79536E−14 | −2.23374E−14 | 2.19562E−15 | |

TABLE 12

Example 4

| Position | Focal length | Fno. | Total angle of view | Variable 1 | Variable 2 | Variable 3 |
|---|---|---|---|---|---|---|
| Wide-angle end | 2.84 | 1.46 | 109.79 | 11.85 | 8.26 | 5.00 |
| Intermediate | 5.33 | 1.84 | 62.55 | 2.74 | 4.79 | 8.47 |
| Telephoto end | 7.82 | 2.55 | 43.25 | 1.63 | 1.33 | 11.94 |

TABLE 13

Example 5

| Si | Ri | Di | Ndj | vdj |
|---|---|---|---|---|
| 1 | 27.7277 | 4.00 | 1.78590 | 44.2 |
| 2 | 12.1543 | 2.53 | | |
| 3 | 15.9081 | 1.83 | 1.90366 | 31.3 |
| 4 | 8.8315 | 5.45 | | |
| 5 | −41.4438 | 0.90 | 1.81568 | 46.4 |
| 6 | 12.3259 | 1.26 | | |
| 7 | 24.4790 | 3.05 | 1.84666 | 23.8 |
| 8 | −22.2264 | 0.44 | | |
| 9* | −20.0675 | 1.04 | 1.79594 | 39.9 |
| 10* | −58.6860 | variable 1 | | |
| 11 (aperture stop) | ∞ | variable 2 | | |
| 12* | 9.2899 | 2.38 | 1.49700 | 81.5 |
| 13* | 400.2794 | 0.10 | | |
| 14 | 23.4713 | 0.97 | 1.74513 | 53.5 |
| 15 | 9.0032 | 4.50 | 1.49700 | 81.5 |
| 16 | −10.1392 | 1.01 | | |
| 17 | 22.5958 | 2.26 | 1.78748 | 33.8 |
| 18 | 5.5265 | 2.96 | 1.49700 | 81.5 |
| 19 | −74.5264 | variable 3 | | |
| 20 | ∞ | 1.50 | 1.51633 | 64.1 |
| 21 | ∞ | 0.93 | | |

TABLE 14

Example 5

Aspherical coefficients of 9th surface

| K | A3 | A4 | A5 | A6 |
|---|---|---|---|---|
| 1.97935E+00 | −2.61195E−04 | −2.78349E−05 | 2.77179E−06 | 4.55382E−07 |
| A7 | A8 | A9 | A10 | A11 |
| −1.46739E−07 | 1.79701E−08 | −2.58669E−09 | −1.32127E−10 | −1.09629E−11 |
| A12 | A13 | A14 | A15 | A16 |
| 7.62891E−13 | 4.49552E−14 | −4.67291E−14 | 6.07865E−15 | 1.56716E−15 |
| A17 | A18 | A19 | A20 | |
| −7.63225E−16 | 2.29441E−17 | −1.87899E−19 | −6.30670E−19 | |

Aspherical coefficients of 10th surface

| K | A3 | A4 | A5 | A6 |
|---|---|---|---|---|
| 5.94702E+01 | −2.60637E−04 | −5.72452E−05 | −9.94304E−07 | 3.80916E−07 |
| A7 | A8 | A9 | A10 | A11 |
| −2.67749E−08 | 1.25689E−08 | 2.43783E−10 | −2.33117E−10 | −2.30893E−11 |
| A12 | A13 | A14 | A15 | A16 |
| −3.25038E−12 | −9.18148E−13 | −5.77743E−14 | 1.32855E−15 | −1.29741E−15 |
| A17 | A18 | A19 | A20 | |
| 1.50066E−16 | 7.38087E−17 | 2.70688E−17 | −4.20799E−18 | |

TABLE 14-continued

Example 5

Aspherical coefficients of 12th surface

| K | A3 | A4 | A5 | A6 |
|---|---|---|---|---|
| 2.60936E+00 | 9.77490E−05 | −4.24224E−04 | 4.08898E−05 | −7.73186E−06 |
| A7 | A8 | A9 | A10 | A11 |
| −3.86456E−06 | 1.97928E−07 | 3.11689E−07 | −5.86781E−08 | −7.32892E−09 |
| A12 | A13 | A14 | A15 | A16 |
| −6.15629E−10 | 7.00323E−10 | 2.94619E−11 | −1.06750E−11 | −3.82655E−12 |
| A17 | A18 | A19 | A20 | |
| −2.82871E−13 | 6.75747E−14 | 4.54579E−14 | −6.15656E−15 | |

Aspherical coefficients of 13th surface

| K | A3 | A4 | A5 | A6 |
|---|---|---|---|---|
| −3.71836E+05 | 3.15654E−04 | 8.29776E−04 | −3.37792E−04 | 1.05298E−04 |
| A7 | A8 | A9 | A10 | A11 |
| −8.93777E−06 | −1.61128E−06 | −6.52667E−08 | 8.10244E−08 | 1.09439E−08 |
| A12 | A13 | A14 | A15 | A16 |
| −3.35176E−09 | 1.56652E−10 | −1.28614E−10 | 6.74671E−12 | 3.46305E−12 |
| A17 | A18 | A19 | A20 | |
| 2.62452E−13 | −3.35941E−14 | −2.22295E−14 | 2.32962E−15 | |

TABLE 15

Example 5

| Position | Focal length | Fno. | Total angle of view | Variable 1 | Variable 2 | Variable 3 |
|---|---|---|---|---|---|---|
| Wide-angle end | 2.90 | 1.46 | 126.94 | 14.17 | 10.22 | 5.00 |
| Intermediate | 6.45 | 1.94 | 57.55 | 0.84 | 5.59 | 9.63 |
| Telephoto end | 10.00 | 2.90 | 37.37 | 0.27 | 0.96 | 14.26 |

TABLE 16

Example 6

| Si | Ri | Di | Ndj | vdj |
|---|---|---|---|---|
| 1 | 23.5030 | 5.50 | 1.78590 | 44.2 |
| 2 | 13.3300 | 3.02 | | |
| 3 | 18.0008 | 1.21 | 1.78590 | 44.2 |
| 4 | 10.8276 | 2.94 | | |
| 5 | 18.4459 | 1.41 | 1.90366 | 31.3 |
| 6 | 8.3087 | 3.71 | | |
| 7 | 50.3720 | 2.42 | 1.68003 | 57.2 |
| 8 | 14.1335 | 1.18 | | |
| 9 | 35.6214 | 4.23 | 1.84666 | 23.8 |
| 10 | −24.7565 | 0.10 | | |
| 11* | −25.0839 | 0.80 | 1.72784 | 47.9 |
| 12* | −415.6721 | variable 1 | | |
| 13 (aperture stop) | ∞ | variable 2 | | |
| 14* | 9.1958 | 2.16 | 1.56865 | 58.3 |
| 15* | 420.7237 | 0.68 | | |
| 16 | 19.7026 | 0.80 | 1.78461 | 54.7 |
| 17 | 9.5204 | 3.88 | 1.43875 | 94.9 |
| 18 | −9.5965 | 0.10 | | |
| 19 | 30.7434 | 1.54 | 1.7894 | 35 |
| 20 | 5.9257 | 3.74 | 1.43875 | 94.9 |
| 21 | −60.0767 | variable 3 | | |
| 22 | ∞ | 1.50 | 1.51633 | 64.1 |
| 23 | ∞ | 2.01 | | |

TABLE 17

Example 6

Aspherical coefficients of 11th surface

| K | A3 | A4 | A5 | A6 |
|---|---|---|---|---|
| 1.51153E+00 | 1.53135E−05 | −1.29918E−05 | 1.94259E−05 | 7.40611E−07 |
| A7 | A8 | A9 | A10 | A11 |
| −5.54297E−07 | 5.99262E−08 | 1.47489E−08 | −2.43655E−09 | −3.38052E−10 |
| A12 | A13 | A14 | A15 | A16 |
| 3.75883E−11 | 1.24004E−11 | −4.47876E−13 | −1.48667E−13 | 1.20344E−14 |
| A17 | A18 | A19 | A20 | |
| −6.53848E−15 | 1.04376E−15 | −1.23871E−17 | −3.20724E−18 | |

Aspherical coefficients of 12th surface

| K | A3 | A4 | A5 | A6 |
|---|---|---|---|---|
| 6.15778E+02 | 3.14953E−05 | −1.16531E−04 | 1.55138E−05 | −1.12166E−06 |
| A7 | A8 | A9 | A10 | A11 |
| 4.94743E−07 | −8.80325E−08 | −3.11690E−09 | 3.41963E−10 | 4.31856E−11 |
| A12 | A13 | A14 | A15 | A16 |
| 1.35997E−11 | 6.03476E−12 | −3.08367E−13 | −9.66016E−14 | −1.44382E−14 |
| A17 | A18 | A19 | A20 | |
| 1.17954E−15 | 1.04623E−16 | 4.05854E−17 | −4.27019E−18 | |

TABLE 17-continued

Example 6

Aspherical coefficients of 14th surface

| K | A3 | A4 | A5 | A6 |
|---|---|---|---|---|
| 2.62093E+00 | 2.77736E−04 | −3.70481E−04 | 6.59883E−05 | −9.43399E−06 |
| A7 | A8 | A9 | A10 | A11 |
| −2.12829E−06 | 1.21820E−07 | 3.00776E−07 | −4.88086E−08 | −7.64490E−09 |
| A12 | A13 | A14 | A15 | A16 |
| −1.09076E−09 | 6.67504E−10 | 5.22823E−11 | −7.65012E−12 | −3.68007E−12 |
| A17 | A18 | A19 | A20 | |
| −3.71267E−13 | 5.11984E−14 | 4.47149E−14 | −5.79184E−15 | |

Aspherical coefficients of 15th surface

| K | A3 | A4 | A5 | A6 |
|---|---|---|---|---|
| −3.40309E+05 | 3.56285E−04 | 9.20485E−04 | −3.28790E−04 | 1.08164E−04 |
| A7 | A8 | A9 | A10 | A11 |
| −7.01381E−06 | −1.76498E−06 | −4.43984E−08 | 7.40475E−08 | 1.12159E−08 |
| A12 | A13 | A14 | A15 | A16 |
| −2.84552E−09 | 2.08904E−10 | −1.34547E−10 | 3.97671E−12 | 3.08415E−12 |
| A17 | A18 | A19 | A20 | |
| 3.04669E−13 | −3.29915E−15 | −2.01036E−14 | 1.27668E−15 | |

TABLE 18

Example 6

| Position | Focal length | Fno. | Total angle of view | Variable 1 | Variable 2 | Variable 3 |
|---|---|---|---|---|---|---|
| Wide-angle end | 2.83 | 1.66 | 120.85 | 20.33 | 10.68 | 5.00 |
| Intermediate | 6.30 | 2.19 | 58.18 | 3.36 | 6.02 | 9.66 |
| Telephoto end | 9.78 | 3.12 | 38.05 | 1.75 | 1.35 | 14.33 |

TABLE 19

Example 7

| Si | Ri | Di | Ndj | vdj |
|---|---|---|---|---|
| 1 | 31.0180 | 4.00 | 1.77250 | 49.6 |
| 2 | 21.8947 | 4.52 | | |
| 3 | 29.5193 | 4.00 | 1.48749 | 70.2 |
| 4 | 13.9897 | 3.76 | | |
| 5 | 22.4382 | 1.00 | 1.48749 | 70.2 |
| 6 | 10.4099 | 3.84 | | |
| 7 | 26.6269 | 0.80 | 1.48749 | 70.2 |
| 8 | 8.6909 | 4.42 | | |
| 9 | −36.7758 | 0.80 | 1.75455 | 45.2 |
| 10 | 43.7570 | 0.10 | | |
| 11 | 18.4874 | 2.60 | 1.84666 | 23.8 |
| 12 | −57.8620 | 0.67 | | |
| 13 | −21.6439 | 0.80 | 1.82626 | 38.0 |
| 14 | −496.7408 | variable 1 | | |
| 15 (aperture stop) | ∞ | variable 2 | | |
| 16* | 10.7317 | 2.48 | 1.49700 | 81.5 |
| 17* | 369.1512 | 0.10 | | |
| 18 | 21.7834 | 0.80 | 1.72916 | 54.7 |
| 19 | 9.7866 | 4.89 | 1.43875 | 94.9 |
| 20 | −9.3938 | 0.10 | | |
| 21 | 17.2344 | 0.80 | 1.8061 | 40.9 |
| 22 | 7.1449 | 5.99 | 1.43875 | 94.9 |
| 23 | −274.3322 | variable 3 | | |
| 24 | ∞ | 1.50 | 1.51633 | 64.1 |
| 25 | ∞ | 2.00 | | |

TABLE 20

Example 7

Aspherical coefficients of 16th surface

| K | A3 | A4 | A5 | A6 |
|---|---|---|---|---|
| 3.33674E+00 | 3.14130E−05 | −4.92477E−04 | 4.90741E−05 | −7.15532E−06 |
| A7 | A8 | A9 | A10 | A11 |
| −4.32354E−06 | 1.09342E−08 | 2.90526E−07 | −6.23907E−08 | −4.72063E−09 |
| A12 | A13 | A14 | A15 | A16 |
| −3.62859E−10 | 7.07532E−10 | 2.91686E−11 | −1.12824E−11 | −3.92963E−12 |
| A17 | A18 | A19 | A20 | |
| −3.16009E−13 | 5.35843E−14 | 4.43838E−14 | −5.34791E−15 | |

Aspherical coefficients of 17th surface

| K | A3 | A4 | A5 | A6 |
|---|---|---|---|---|
| −1.59848E+05 | 7.91782E−05 | 6.96254E−04 | −3.29378E−04 | 1.05806E−04 |
| A7 | A8 | A9 | A10 | A11 |
| −1.02914E−05 | −1.77944E−06 | −6.89067E−08 | 8.57574E−08 | 1.17004E−08 |
| A12 | A13 | A14 | A15 | A16 |
| −3.26422E−09 | 1.53657E−10 | −1.21275E−10 | 5.55279E−12 | 3.41109E−12 |
| A17 | A18 | A19 | A20 | |
| 3.33922E−13 | −6.24197E−14 | −2.10377E−14 | 2.60884E−15 | |

TABLE 21

Example 7

| Position | Focal length | Fno. | Total angle of view | Variable 1 | Variable 2 | Variable 3 |
|---|---|---|---|---|---|---|
| Wide-angle end | 2.75 | 1.49 | 136.81 | 16.22 | 11.71 | 5.00 |
| Intermediate | 6.11 | 1.97 | 61.23 | 2.44 | 6.53 | 10.18 |
| Telephoto end | 9.47 | 2.95 | 39.61 | 2.13 | 1.35 | 15.37 |

TABLE 22

Example 8

| Si | Ri | Di | Ndj | vdj |
|---|---|---|---|---|
| 1 | 30.7602 | 4.00 | 1.77250 | 49.6 |
| 2 | 23.6982 | 4.50 | | |
| 3 | 30.7259 | 4.00 | 1.84666 | 23.8 |
| 4 | 35.6786 | 0.99 | | |
| 5 | 24.3632 | 3.00 | 1.72916 | 54.7 |
| 6 | 10.3532 | 3.87 | | |
| 7 | 21.5759 | 0.80 | 1.77250 | 49.6 |

TABLE 22-continued

Example 8

| Si | Ri | Di | Ndj | vdj |
|---|---|---|---|---|
| 8 | 7.4420 | 4.32 | | |
| 9 | ∞ | 0.80 | 1.49700 | 81.5 |
| 10 | 14.4378 | 0.83 | | |
| 11 | 30.7152 | 2.39 | 1.84666 | 23.8 |
| 12 | −24.1549 | 0.28 | | |
| 13* | −48.1754 | 0.80 | 1.68893 | 31.1 |
| 14* | 22.4811 | variable 1 | | |
| 15 (aperture stop) | ∞ | variable 2 | | |
| 16* | 15.9258 | 2.01 | 1.49700 | 81.5 |
| 17* | 624.9430 | 0.10 | | |
| 18 | 20.8428 | 0.80 | 1.52249 | 59.8 |
| 19 | 12.9042 | 5.16 | 1.43875 | 94.9 |
| 20 | −10.4681 | 0.10 | | |
| 21 | 31.9817 | 0.80 | 1.83481 | 42.7 |
| 22 | 8.6198 | 4.08 | 1.43875 | 94.9 |
| 23 | −19.3891 | variable 3 | | |
| 24 | 149.8653 | 1.71 | 1.43875 | 94.9 |
| 25 | −22.257 | 1.45 | 1.80400 | 46.6 |
| 26 | −33.9684 | 5.00 | | |
| 27 | ∞ | 1.50 | 1.51633 | 64.1 |
| 28 | ∞ | 2.01 | | |

TABLE 23

Example 8

Aspherical coefficients of 13th surface

| K | A3 | A4 | A5 | A6 |
|---|---|---|---|---|
| 4.84693E+01 | −4.37295E−05 | −1.39711E−03 | 4.02366E−05 | 5.82479E−05 |
| A7 | A8 | A9 | A10 | A11 |
| 1.16720E−06 | −1.68063E−06 | −5.07769E−07 | 1.32601E−07 | 3.94367E−09 |
| A12 | A13 | A14 | A15 | A16 |
| −1.09023E−09 | −2.25118E−10 | 4.35299E−12 | 3.51293E−12 | −1.40148E−13 |
| A17 | A18 | A19 | A20 | |
| 3.59516E−14 | −9.44198E−16 | −1.04176E−15 | 7.76239E−17 | |

Aspherical coefficients of 14th surface

| K | A3 | A4 | A5 | A6 |
|---|---|---|---|---|
| −6.32254E+01 | −3.80389E−04 | −4.66923E−04 | −2.07618E−04 | 7.98888E−05 |
| A7 | A8 | A9 | A10 | A11 |
| 4.10627E−06 | −3.38731E−06 | −1.59939E−07 | 9.53406E−08 | 1.57877E−09 |
| A12 | A13 | A14 | A15 | A16 |
| 2.82785E−10 | −2.87572E−10 | −8.16405E−12 | 4.35402E−12 | −2.17947E−13 |
| A17 | A18 | A19 | A20 | |
| −3.03726E−14 | 4.52822E−15 | 2.05464E−15 | −2.61566E−16 | |

Aspherical coefficients of 16th surface

| K | A3 | A4 | A5 | A6 |
|---|---|---|---|---|
| 6.93475E+00 | 4.93600E−04 | −6.57759E−04 | 1.07423E−04 | 1.51399E−05 |
| A7 | A8 | A9 | A10 | A11 |
| −1.33239E−05 | −2.92124E−07 | 4.36997E−07 | 7.89850E−08 | −3.95271E−08 |
| A12 | A13 | A14 | A15 | A16 |
| 5.27871E−09 | −6.70133E−10 | 5.54400E−11 | 8.95559E−12 | −1.87711E−12 |
| A17 | A18 | A19 | A20 | |
| −1.26405E−13 | 3.92265E−14 | 4.95597E−15 | −1.01928E−15 | |

Aspherical coefficients of 17th surface

| K | A3 | A4 | A5 | A6 |
|---|---|---|---|---|
| −5.81844E+05 | 6.72586E−04 | 1.93061E−05 | 2.85766E−05 | 1.53356E−05 |
| A7 | A8 | A9 | A10 | A11 |
| −7.23213E−06 | 2.42589E−06 | −1.05199E−06 | 1.08339E−07 | 4.01348E−08 |
| A12 | A13 | A14 | A15 | A16 |
| −8.71853E−09 | 4.05402E−10 | −3.11007E−11 | −1.30264E−11 | 3.04202E−12 |
| A17 | A18 | A19 | A20 | |
| 6.03886E−13 | −5.54732E−14 | −1.87329E−14 | 1.86351E−15 | |

TABLE 24

Example 8

| Position | Focal length | Fno. | Total angle of view | Variable 1 | Variable 2 | Variable 3 |
|---|---|---|---|---|---|---|
| Wide-angle end | 2.75 | 1.36 | 117.63 | 14.07 | 13.37 | 0.80 |
| Intermediate | 6.11 | 1.78 | 55.32 | 1.98 | 7.35 | 6.82 |
| Telephoto end | 9.47 | 2.88 | 35.96 | 2.75 | 1.34 | 12.83 |

With respect to the variable magnification optical system of Example 1, spherical aberration, astigmatism and distortion at the wide-angle end are shown at A to C in FIG. 9, respectively, spherical aberration, astigmatism and distortion at the intermediate focal position are shown at D to F in FIG. 9, respectively, and spherical aberration, astigmatism and distortion at the telephoto end are shown at G to I in FIG. 9, respectively. Each aberration diagram is with respect to the d-line serving as the reference. The spherical aberration diagram also shows aberrations with respect to the g-line (a wavelength of 435.8 nm), the C-line (a wavelength of 656.3 nm) and a wavelength of 880 nm. In the astigmatism diagram, an aberration in the sagittal direction is shown in the solid line and an aberration in the tangential direction is shown in the dashed line. The "Fno." in the spherical aberration diagram means the f-number. The symbol "ω" in the other aberration diagrams means the half angle of view.

Similarly, aberration diagrams at the wide-angle end, at the intermediate focal position and at the telephoto end of the variable magnification optical systems of Examples 2 to 8 are shown at A to I in FIG. 10, at A to I in FIG. 11, at A to I in FIG. 12, at A to I in FIG. 13, at A to I in FIG. 14, at A to I in FIG. 15, and at A to I in FIG. 16.

Table 25 shows values corresponding to the conditional expressions (1) to (6) of the variable magnification optical systems of Examples 1 to 8. All the variable magnification optical systems of Examples 1 to 8 satisfy the conditional expressions (1) to (6)

TABLE 25

| | (1) $(R23f+R23r)/(R23f-R23r)$ | (2) vd23 | (3) vd25 | (4) R23r/R22f | (5) $|R22r|-|R24r|$ | (6) fG2/fw |
|---|---|---|---|---|---|---|
| Example 1 | 0.00 | 81.5 | 81.5 | −0.47 | 7.26 | 3.99 |
| Example 2 | −0.05 | 81.5 | 94.9 | −0.27 | 3.21 | 4.30 |
| Example 3 | −0.16 | 81.5 | 81.5 | −0.38 | 1.53 | 4.20 |
| Example 4 | −0.08 | 81.5 | 81.5 | −0.48 | 2.21 | 3.64 |
| Example 5 | −0.06 | 81.5 | 81.5 | −0.43 | 3.48 | 3.83 |
| Example 6 | 0.00 | 94.9 | 94.9 | −0.49 | 3.59 | 4.32 |
| Example 7 | 0.02 | 94.9 | 94.9 | −0.43 | 2.64 | 4.40 |
| Example 8 | 0.10 | 94.9 | 94.9 | −0.50 | 4.28 | 4.63 |

FIG. 17 shows, as one example of an imaging apparatus according to an embodiment of the invention, a schematic configuration diagram of an imaging apparatus employing the variable magnification optical system of the embodiment of the invention. The imaging apparatus may, for example, be a monitoring camera, a video camera, an electronic still camera, or the like.

The imaging apparatus 10 shown in FIG. 17 includes a variable magnification optical system 1, a filter 2 disposed on the image side of the variable magnification optical system 1, an image sensor 3 for taking an image of a subject focused by the variable magnification optical system, and a signal processing unit 4 for processing an output signal from the image sensor 3. The variable magnification optical system 1 includes the negative first lens group G1, the aperture stop St and the positive second lens group G2. In FIG. 17, each lens group is conceptually shown. The image sensor 3 converts an optical image formed by the variable magnification optical system 1 into an electric signal, and the imaging surface of the image sensor 3 is positioned to correspond to the image plane of the variable magnification optical system. As the image sensor 3, a CCD or a CMOS may be used, for example.

The imaging apparatus 10 includes a magnification change controller 5 for performing the magnification change of the variable magnification optical system 1, a focus controller 6 for controlling the focus of the variable magnification optical system 1, and an aperture controller 7 for changing the aperture diameter of the aperture stop St. It should be noted that the aperture controller 7 may be omitted.

The present invention has been described with reference to the embodiments and examples. However, the invention is not limited to the above-described embodiments and examples, and various modifications may be made to the invention. For example, the values of the radius of curvature, the surface interval, the refractive index, the Abbe number, the aspherical coefficients, etc., of each lens are not limited to the values shown in the above-described numerical examples and may take different values.

What is claimed is:

1. A variable magnification optical system comprising, in order from an object side, a first lens group having a negative refractive power, a stop and a second lens group having a positive refractive power, the variable magnification optical system being configured such that magnification change is achieved by changing an interval between the first lens group and the second lens group in an optical axis direction, and correction of an image plane position along with the magnification change is achieved by moving the first lens group in the optical axis direction, wherein
  a most image-side lens in the first lens group is a single lens having a negative refractive power with a concave surface facing the object side and a second most image-side lens in the first lens group is a single lens having a positive refractive power,
  the second lens group includes, in order from the object side, a positive lens disposed at a most object-side position with at least one surface thereof being an aspherical surface, a first cemented lens formed by a negative lens and a positive lens that are cemented together in this order from the object side, and a second cemented lens formed by a negative lens and a positive lens that are cemented together in this order from the object side,
  an image-side surface of the negative lens forming the first cemented lens and an image-side surface of the negative lens forming the second cemented lens are concave surfaces, and
  conditional expression (1) below is satisfied:

$$-0.5<(R23f+R23r)/(R23f-R23r)<0.5 \quad (1),$$

where R23f is a radius of curvature of an object-side surface of the positive lens forming the first cemented lens, and R23r is a radius of curvature of an image-side surface of the positive lens forming the first cemented lens.

2. The variable magnification optical system as claimed in claim 1, wherein conditional expression (1-1) below is satisfied:

$$-0.25<(R23f+R23r)/(R23f-R23r)<0.25 \quad (1-1).$$

3. The variable magnification optical system as claimed in claim 1, wherein conditional expressions (2) and (3) below are satisfied:

$$vd23 > 70.0 \qquad (2) \text{ and}$$

$$vd25 > 70.0 \qquad (3),$$

where vd23 is an Abbe number with respect to the d-line of the positive lens forming the first cemented lens, and vd25 is an Abbe number with respect to the d-line of the positive lens forming the second cemented lens.

4. The variable magnification optical system as claimed in claim 3, wherein conditional expression (2-1) below is satisfied:

$$vd23 > 80.0 \qquad (2\text{-}1).$$

5. The variable magnification optical system as claimed in claim 3, wherein conditional expression (3-1) below is satisfied:

$$vd25 > 80.0 \qquad (3\text{-}1).$$

6. The variable magnification optical system as claimed in claim 1, wherein conditional expression (4) below is satisfied:

$$-1 < R23r/R22f < 0 \qquad (4),$$

where R23r is a radius of curvature of an image-side surface of the positive lens forming the first cemented lens, and R22f is a radius of curvature of an object-side surface of the negative lens forming the first cemented lens.

7. The variable magnification optical system as claimed in claim 6, wherein conditional expression (4-1) below is satisfied:

$$-0.7 < R23r/R22f < 0 \qquad (4\text{-}1).$$

8. The variable magnification optical system as claimed in claim 1, wherein conditional expression (5) below is satisfied:

$$|R22r| - |R24r| > 0 \qquad (5),$$

where R22r is a radius of curvature of an image-side surface of the negative lens forming the first cemented lens, and R24r is a radius of curvature of an image-side surface of the negative lens forming the second cemented lens.

9. The variable magnification optical system as claimed in claim 1, wherein the single lens having a positive refractive power disposed at the second most image-side position in the first lens group has a shape with a convex surface facing an image side.

10. The variable magnification optical system as claimed in claim 1, wherein conditional expression (6) below is satisfied:

$$3.0 \leq fG2/fw < 5.0 \qquad (6),$$

where fG2 is a focal length of the second lens group, and fw is a focal length of the entire system at a wide-angle end.

11. The variable magnification optical system as claimed in claim 1, wherein lens groups of the variable magnification optical system consist of the first lens group and the second lens group.

12. The variable magnification optical system as claimed in claim 1, further comprising a third lens group having a positive refractive power disposed on the image side of the second lens group, the third lens group being fixed during the magnification change.

13. The variable magnification optical system as claimed in claim 12, wherein lens groups of the variable magnification optical system consist of the first lens group, the second lens group and the third lens group.

14. The variable magnification optical system as claimed in claim 1, wherein the first lens group includes at least one lens having a negative refractive power with at least one surface thereof being an aspherical surface.

15. An imaging apparatus comprising the variable magnification optical system as claimed in claim 1.

16. A variable magnification optical system comprising, in order from an object side, a first lens group having a negative refractive power, a stop and a second lens group having a positive refractive power, the variable magnification optical system being configured such that magnification change is achieved by changing an interval between the first lens group and the second lens group in an optical axis direction, and correction of an image plane position along with the magnification change is achieved by moving the first lens group in the optical axis direction, wherein a most image-side lens in the first lens group is a single lens having a negative refractive power with a concave surface facing the object side and a second most image-side lens in the first lens group is a single lens having a positive refractive power, the second lens group includes, in order from the object side, a positive lens disposed at a most object-side position with at least one surface thereof being an aspherical surface, a first cemented lens formed by a negative lens and a positive lens that are cemented together in this order from the object side, and a second cemented lens formed by a negative lens and a positive lens that are cemented together in this order from the object side, the first cemented lens and the second cemented lens are disposed next to each other, and an image-side surface of the negative lens forming the first cemented lens and an image-side surface of the negative lens forming the second cemented lens are concave surfaces.

17. An imaging apparatus comprising the variable magnification optical system as claimed in claim 16.

* * * * *